United States Patent [19]
Fudanuki et al.

[11] Patent Number: 6,054,872
[45] Date of Patent: Apr. 25, 2000

[54] SEMICONDUCTOR INTEGRATED CIRCUIT WITH MIXED GATE ARRAY AND STANDARD CELL

[75] Inventors: Nobuo Fudanuki; Toshikazu Sei, both of Tokyo, Japan

[73] Assignee: Kabushiki Kaisha Toshiba, Kawasaki, Japan

[21] Appl. No.: 08/997,035

[22] Filed: Dec. 23, 1997

[30] Foreign Application Priority Data

Dec. 27, 1996 [JP] Japan ..................................... 8-351360
Dec. 12, 1997 [JP] Japan ..................................... 9-343278

[51] Int. Cl.⁷ .............................................. H03K 19/177
[52] U.S. Cl. ............................................. 326/39; 326/101
[58] Field of Search ....................... 326/39, 41, 101–103; 327/403–405, 565, 566

[56] References Cited

U.S. PATENT DOCUMENTS

| | | | |
|---|---|---|---|
| 4,207,556 | 6/1980 | Sugiyama et al. | 326/101 |
| 4,750,027 | 6/1988 | Asami | 326/101 |
| 4,809,029 | 2/1989 | Matsumura et al. | 364/926 |
| 4,811,073 | 3/1989 | Kitamura et al. | 257/203 |
| 4,949,275 | 8/1990 | Nonaka | 395/500.09 |
| 4,967,100 | 10/1990 | Okutsu et al. | 327/403 |
| 4,969,029 | 11/1990 | Ando et al. | 438/129 |
| 5,051,917 | 9/1991 | Gould et al. | 326/102 |
| 5,155,390 | 10/1992 | Hickman et al. | 326/101 |

Primary Examiner—Michael Tokar
Assistant Examiner—Don Phu Le
Attorney, Agent, or Firm—Foley & Lardner

[57] ABSTRACT

The present invention relates to a semicustom ASIC, in which a plurality of standard cell rows are arranged. The standard cell and basic cells used in a gate array are mixedly mounted on the same chip. Respective cell rows are composed of a plurality of standard cells with an empty space. The basic cells used in the gate array are arranged as dummy cells. They are disposed in wiring channel regions between the plurality of standard cells or empty spaces between the standard cells in a same standard cell row. Only the latter may be used if the channelless type standard cells are employed. A changing request can be satisfied by forming metal wiring layers on the gate array basic cells when there is a necessity of changing circuit design or pattern. Since the circuit can be modified without change of gate polysilicon regions and source/drain regions underlying the metal wiring layers, design and manufacture can be effected in a short period of time.

21 Claims, 17 Drawing Sheets

CLOCK DRIVER

CLOCK DRIVER

SEMICONDUCTOR INTEGRATED CIRCUIT WITH MIXED GATE ARRAY AND STANDARD CELL

BACKGROUND OF THE INVENTION

1. Field of the Invention

The present invention relates to an integrated circuit using a standard cell design methodology in which gate array basic cells are mixedly-mounted on a circuit which is constructed by use of standard cells.

2. Description of the Prior Art

A fulcustom IC is suitable for the case where high performance ICs are mass-produced, but it has such a disadvantage that a period of time required from design process to manufacture process is long. On the contrary, a semicustom IC is suitable for the case where a user-oriented LSI should be developed in a short period of time if patterns of the logic cells, etc. are executed according to design automation (DA) by using a computer. Sometimes design automation by using the computer can be introduced into the fulcustom design. In this case, mainly such automation is applied to prediction of circuit operation and pattern verification. Standardization of design automation has not been carried out in other design aspects and therefore the designer has proceeded circuit design in an interactive manner with manual intervention, i.e., so-called computer-aided design approach has been introduced.

Meanwhile, the semicustom approach is design automation by use of the computer because design techniques are standardized, and the gate array design methodology and the standard cell design methodology have been known. According to the gate array design methodology, a master chip on which basic cells are arranged in a matrix form is prepared in advance, then only metal wiring layer design on the basic cells is executed, and then the user oriented LSI can be developed in a short period of time by laying wiring connection of the metal wiring layers. Factors to enable development of the gate array in a short period of time are (a) the manufacturing step is only a wiring step for the metal wiring layer; (b) packaging and evaluation term is short since chip size, number of pads, etc. are determined previously; and (c) verification of function can be conducted quickly and troubles due to miss can be reduced smaller since verified cells are used and LSIs are designed and logically verified by means of design automation.

While, the standard cell design methodology is resemble to the gate array design methodology in a respect that the integrated circuit to satisfy desired logical functions can be achieved by use of a cell library in which information of the cells being designed and verified manually or by the computer in advance are stored. However, usually the cells used in the standard cell architecture have logical functions like a simple logic gate and a flip-flop, and in many cases have rectangular patterns with a uniform height H and widths W, the width W is set to be variable geometrically. As shown in FIG. 1, normally the standard cells (SC1, SC2, SC3, SC4, SC5, . . . ) 100 are never spread all over the surface of the chip 101. In other words, wiring channel regions in which the metal wirings to connect the standard cells 100 are formed between device rows on the chip 101. The empty space 102 in which no standard cell 100 is arranged still remain in each device row as regions in which no functional device such as transistor is formed and which is used only to form the metal wirings.

In the integrated circuit being constructed by use of such standard cells, when design change is needed due to circuit change, etc., only the metal wirings may be modified unless the number of transistors and the configuration are still not changed, but further transistors must be added newly if extra transistors are needed. In this case, design change cannot be satisfied only by changing the metal wirings and thus preceding steps rather than the last few wiring steps in the fabrication process, i.e., selective ion-implantation steps to form diffusion layers of the source/drain regions constituting the transistor, CVD step and RIE step to form the polysilicon layer, must be changed. Of course, change of the mask patterns used in these steps is also added to such change of steps. Therefore, if the circuit change with additional arrangement of the transistors is demanded, turn around time of the LSI using the standard cell approach is extended.

On the contrary, the gate array design style is a design in which a desired circuit is constructed by providing the wirings to the basic cells which are arranged regularly and fixedly on the matrix. The basic cells used in the gate array approach are identical cells which have no logic function by themselves, simple logic cells such as simple gates, flip-flop, etc. which are formed by connecting one or plural basic cells simply, and the like. In the integrated circuit using such gate array design style, especially the circuit called "as whole surface spread-over type", the uniform transistor array are arranged all over the chip surface in advance and then various circuits can be constructed with the use of a part of the array. In the gate array architecture, like the standard cell architecture, the transistors not used also remain as they are. Therefore, if the circuit change is demanded, such circuit change can be treated only by changing the metal wirings while using such unused transistors. In addition, since a master-slice prepared previously is used in the gate array chip, a term for last few manufacturing steps of metal wirings is required, so that the circuit can be developed in a short period of time. However, since only the basic cells being prepared beforehand can be used upon design of the circuit in the gate array design, there has been such a disadvantage that a margin in circuit design is limited, for example, the size of the transistors cannot be reduced.

Memory, CPU core, ALU, A/D converter, D/A converter, display, and various I/O circuits are included almost surely in the large scale circuit system. And as the circuit scale is made huge, the necessity to mount such subsystems on the same chip arisen. Hence, recently memory/logic mixedly mounting design methodology, analogue/digital mixedly mounting design methodology, etc. become important. For this reason, there have been developed a composite gate array in which memory leased regions are provided in a part of the master chip, or "an embedded array" in which manufacturing of the substrate and design of the gate array portion can be advanced simultaneously by combining a logic circuit area consisting of the channelless gate array and the large capacity memory or the processor core on the same chip. This array is highly observed recently since the integration density and flexibility like the standard cell can be obtained and the development term can be shortened like the gate array. In FIG. 2, a case is shown wherein the channelless type gate array region 221 and the channelless type standard cell region 222 together with a megacell 213 and megafunctions 211, 212 are formed on the chip 201. The "megacell 213" means the cell which has fixed layout pattern of the cell, and the representative megacell is memory such as ROM or RAM, multiplier, etc. whose performance depends on the layout. The "megafunctions 211, 212" means the circuit which can be implemented by combination of macrocells on the layout though it is treated theoretically as a lump of cells, and the representative megafunction is ALU, CPU core, etc. whose chip integration degree is affected by connection relationship between the megafunction and other blocks. The channelless type gate array region 221 is a gate array region in which the wiring channel region is eliminated, the gate array is spread over the whole logic circuit area 221, and the basic cell can be used as either the wirings or functional block according to the demand. The channelless type standard cell region 222 is a region in which the wiring channel region is eliminated and the standard cells is spread over the whole logic circuit area 222.

As stated above, in the integrated circuit using the standard cell architecture in the prior art, if the circuit change with additional arrangement of the transistors is demanded, "pre-stage-steps" of all steps to manufacture the integrated circuit, which need a long period of time necessary for process such as formation of the source/drain diffusion layers or the gate polysilicon layer, must be changed. As a result, for example, though the metal wiring step takes about two days, normally "pre-stage-steps" including the diffusion step applied below the metal wiring layer take more than seven days.

In contrast, in the integrated circuit using the gate array architecture in the prior art, since design change can be effected only by changing the wirings, there has been such an advantage that the circuit change can be easily carried out. Conversely, since the basic cells used are simple, a margin in circuit design is low rather than the standard cell layout. For this reason, in the integrated circuit using the gate array layout, there have been disadvantages that circuit design becomes difficult and sometimes it becomes difficult to achieve desired circuit performance. For instance, such a disadvantage is caused that, if it is desired to reduce power consumption in the particular circuit, excessive current are passed because the sizes of the transistors are fixed.

These problems are caused similarly in the embedded array shown in FIG. 2. Even the region 222 in which the standard cells are spread all over the logic circuit area and the region 221 in which the gate array is spread all over the logic circuit area cannot be escaped from natural performances end characteristics of the standard cells and the gate array, and therefore they cannot overcome the natural problems included in the conventional cells at all.

SUMMARY OF THE INVENTION

Therefore, the present invention has been made in view of the above circumstances and it is an object of the present invention to provide an integrated circuit using a standard cell architecture capable of executing modification of cell arrangement, wirings, and circuit easily on a chip and achieving shortening of development period.

It is a concrete object of the present invention to provide an integrated circuit using a standard cell architecture capable of executing easily circuit modification such as increase/decrease of driving capability of the circuit, increase/decrease of power consumption, etc. in the circuit and being manufactured in a short period of time.

In order to achieve the above objects, a first feature of the present invention is a semicustom integrated circuit comprising a plurality of cell rows, in each row a plurality of standard cells are arranged, and sate array basic cells formed in empty spaces of a predetermined cell row out of the plurality of cell rows. Where the cell row is of course constructed by arranging a plurality of standard cells with the empty space. Respective standard cells are formed on a basis of a rectangular pattern reason having a predetermined uniform height H and a predetermined width W. That is, an outer shape of the standard cell is the rectangular pattern region of (height H)×(width W). The width W of the rectangular pattern is variable and can take various values. It is preferable that the gate array basic cells formed in empty spaces of the standard cells are formed on a basis of a rectangular pattern having a predetermined width W and a height H substantially identical to that of the standard cells since the wiring can be made easy. The wording "on a basis of a rectangular pattern" means that the outer shape of the gate array basic cell takes the rectangular pattern shape of (height H)×(width W) apart from the shapes of transistors, etc. in the cell. The gate array basic cell may be formed not only in the empty spaces of the standard cells but also the wiring channel regions between the plurality of cell rows. In addition, if an integration degree of LSI chip will be increased, the gate array basic cells may be formed in the empty spaces of the standard cells in respective predetermined cell rows, in the channelless standard cells in which the free areas as the wiring channel regions between the plurality of cell rows can be removed and respective cell rows are disposed adjacently mutually.

According to a first feature of the present invention, the gate array basic cells are arranged preliminarily in the empty spaces in which the standard cells are not arranged, and then the circuit change is made by use of the basic cells when demand for circuit change is generated. Therefore, various circuit change can be implemented only by changing the overlying wiring patterns with no influence on the "underlying patterns" of the standard cells, so that turn around time can be shortened. In the LSI manufacturing process, since it takes a lot of time to form the polysilicon gate regions and the source/drain regions below the wiring layers, development time of the integrated circuit can be extremely reduced by neglecting such change of underlying patterns when the design change or specification change occurs. Furthermore, intermediate buffers can be arranged easily by means of combinations of the standard cells and the basic cells to increase the driving capability and to suppress the clock skew. In addition, if the standard cells and the basic cells are arranged pursuant to the same grid system, or if heights of both rectangular patterns are arranged to coincide with each other and design specifications are arranged to mate with each other, mixed standard cell and basic cell layout can be facilitated and also constraints in arrangement and routing can be relaxed widely in contrast to the prior art.

A second feature of the present invention relates to a large scale circuit system including memories, CPU core, ALU, A/D converter, D/A converter, display, and various I/O circuits. In other words, the second feature of the present invention resides in that a logic circuit area (a logic block) having mixed standard cell and gate array layout and a megacell (and/or a megafunction) are provided on a same semiconductor chip (LSI chip). Where the term "megacell" means the cell which has fixed layout pattern of the cell, and the representative megacell is memory such as ROM or RAM, multiplier, etc. whose performance depends on the layout. The term "megafunction" means the circuit which can be implemented by combination of macrocells on the layout though it is treated theoretically as a lump of cells, and the representative megafunction is ALU, CPU core, etc. whose chip integration degree is affected by connection relationship between the megafunction and other blocks.

In the prior art, the LSI chip in which the megacells, etc. and the logic circuit areas (logic blocks) are mounted on the same chip has been proposed. However, in this case, only the standard cells or only the gate array basic cells are spread over entirely in the logic circuit area. Hence, in the large scale circuit system, if the specification changes or design changes are requested, patterns of underlying gate polysilicon regions and source/drain regions must be changed and accordingly a series of process steps such as ion-implantation, oxidation, CVD, RIE, etc. must be executed again. Thus, the turn around time is prolonged and therefore such approach cannot quickly respond to design change, specification change of the integrated circuit.

According to the second feature of the present invention, the gate array basic cells are arranged preliminarily in the empty spaces in which the standard cells are not arranged in the logic circuit area, and the circuit change can be made by use of the basic cells when demand for circuit change is generated. Therefore, various circuit change can be implemented only by changing the metal wirings with no influence on the circuit configuration of the standard cells. In other words, there is no need for executing ion-implantation process of the underlying layer, etc. once again and various circuit changes can be enabled only by changing the overlying metal wiring layers, so that development term can be shortened. In addition, if specifications of the standard cells SC and the basic cells GC are mated with each other to be arranged on the same grid, mixed standard cell and basic cell layout can be facilitated and also constraints in arrangement and routing can be relaxed widely in contrast to the prior art.

Especially, the gate array basic cells have such a disadvantage that sometimes power consumption cannot be reduced by reducing the transistors according to specification since sizes of the transistors are fixed. In contrast, since sizes of the transistors can be varied even if the height of the cell is fixed, power consumption in the standard cells can be reduced by reducing the sizes of the transistors according to requested specifications. Hence, power consumption of overall LSI chip can be reduced by combining the gate array basic cells with the standard cells appropriately. In other words, both the feature that high integration density of the standard cells and low power consumption can be made easy by mixedly mounting the standard cells and the gate array basic cells in the logic circuit area (logic block) and that flexibility in circuit design can be enhanced, and the feature that enables short development period of time of the gate array can be achieved commonly. Furthermore, it is similar to the first feature that intermediate buffers can be arranged easily by means of combinations of the standard cells and the basic cells to increase the driving capability and to suppress the clock skew. Likewise, according to the second feature of the present invention, improvement in characteristics of the large scale LSI chip such as calculation time, power consumption, etc. and high integration density can be facilitated and in addition flexible circuit design can be achieved. And, the turn around time can be shortened since such approach can quickly respond to the design change.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIGS. 5A to 5C illustrate an integrated circuit according to a first example of the first embodiment of the present invention, wherein FIG. 5A is a plan view showing patterns of underlying layers. FIG. 5B is a plan view showing overlying metal wiring layers formed on the pattern shown in FIG. 5A, and FIG. 5C is a view showing an equivalent circuit of the circuit shown in FIG. 5B;

DETAILED DESCRIPTION OF THE EMBODIMENTS

Figure 1:
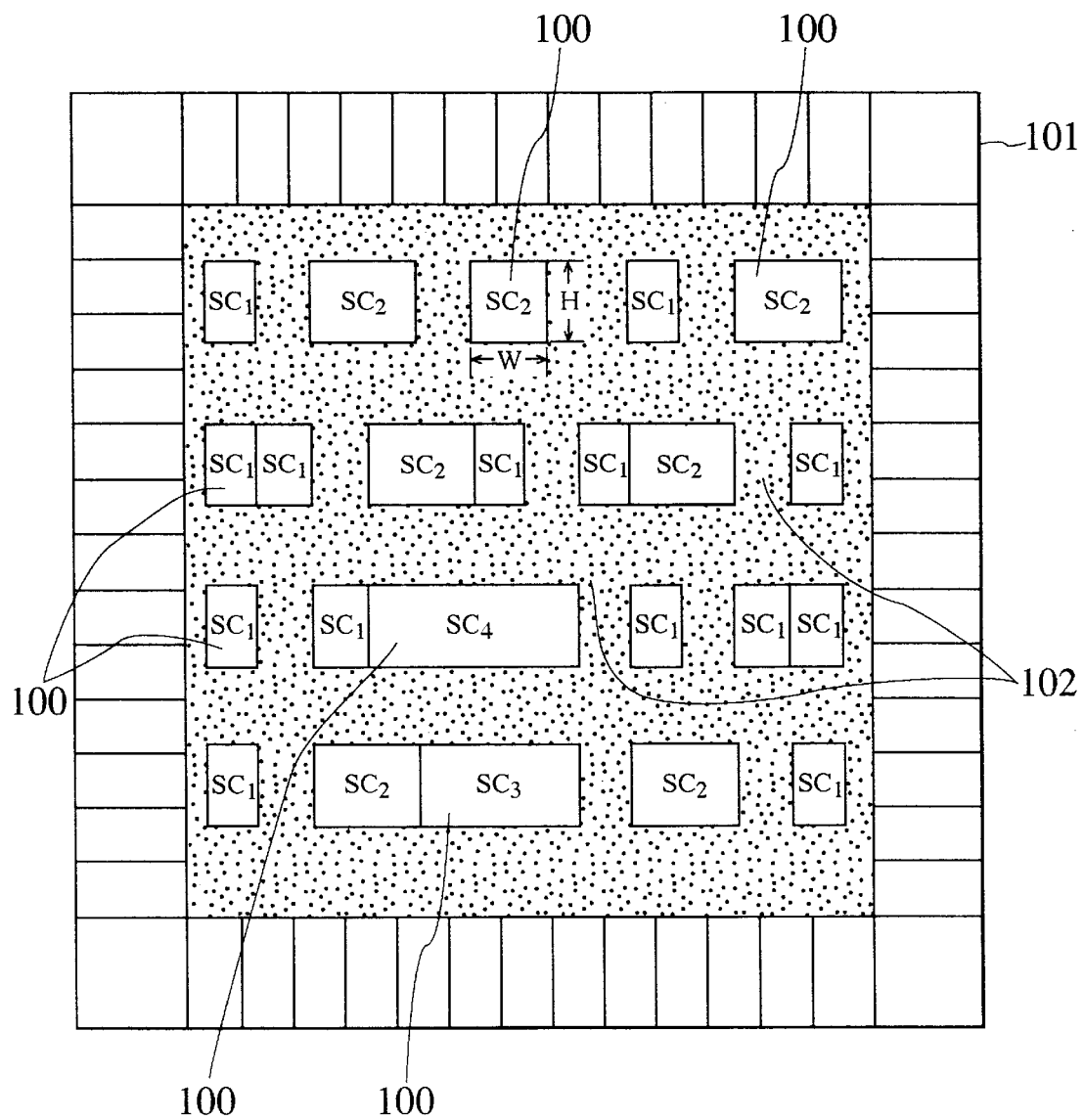
FIG. 1 is a plan view showing an overall configuration of an integrated circuit chip using a standard cell layout in the prior art.
Figure 2:
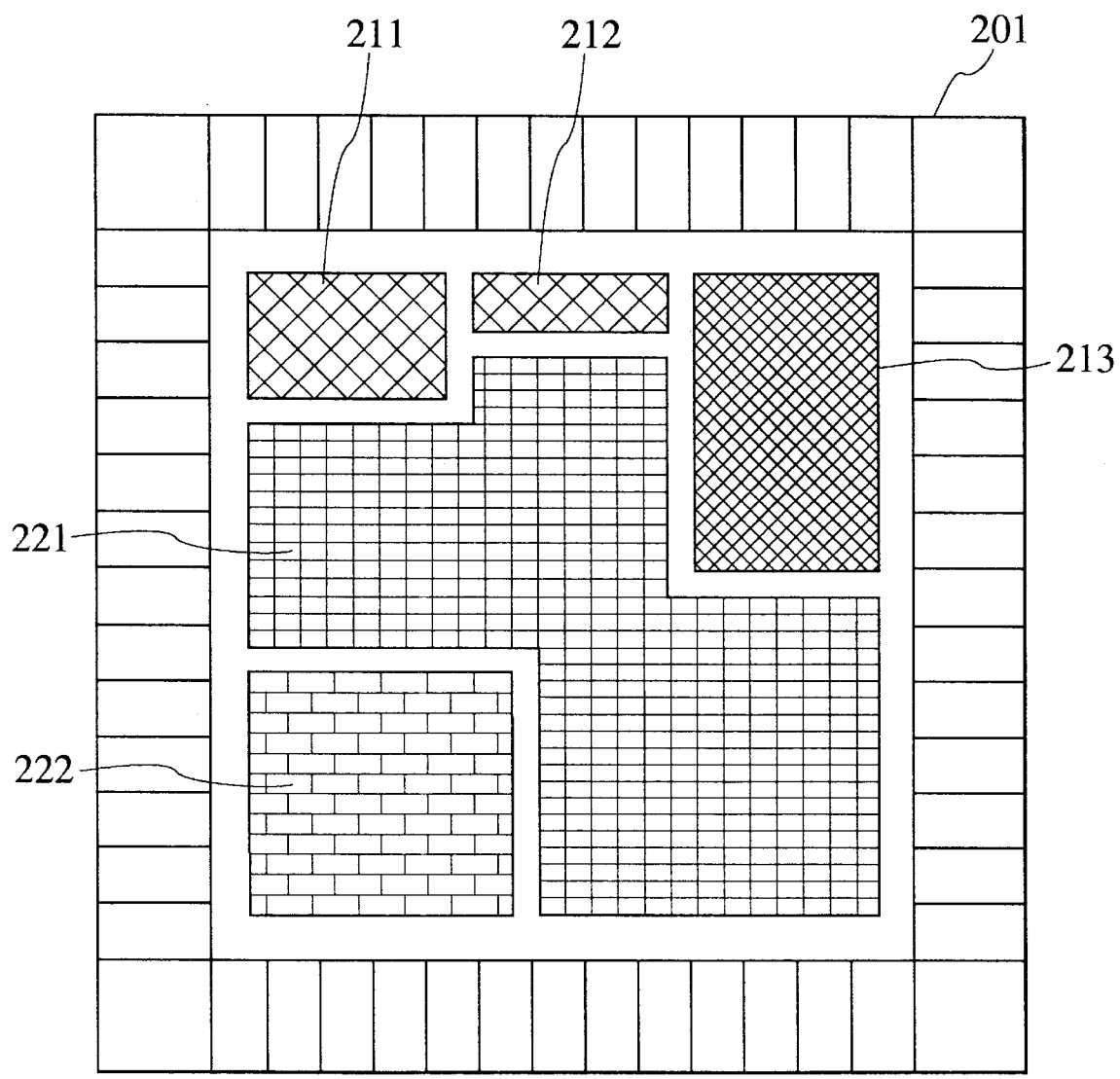
FIG. 2 is a plan view showing an overall configuration of an embedded array chip in the prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 3A:
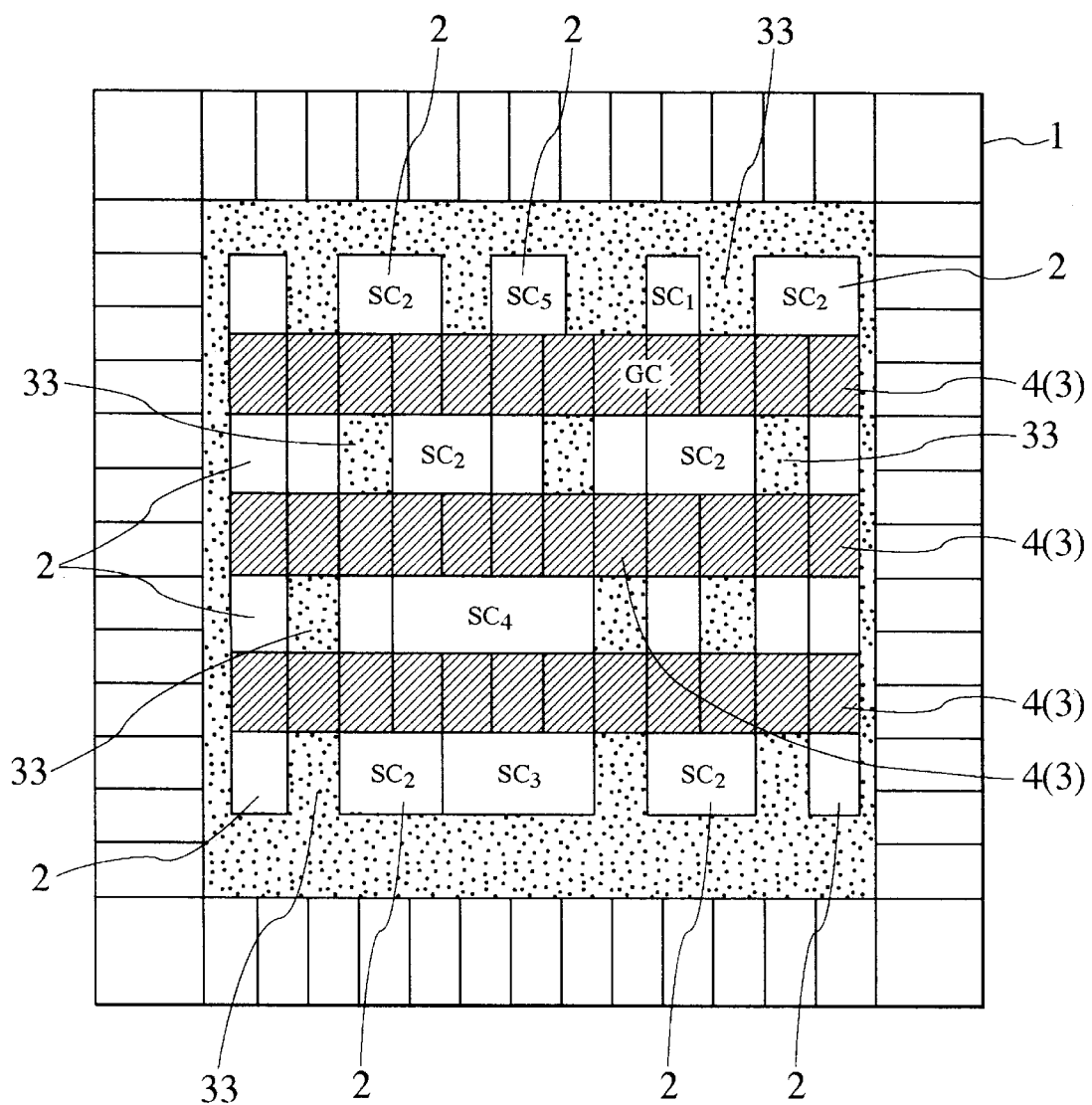
FIGS. 3A to 3D are plan views showing various configurations of integrated circuits using a hybrid standard cell architecture according to a first embodiment of the present invention.

FIG. 3A is a view showing a configuration of an integrated circuit using a hybrid standard cell architecture according to a first embodiment of the present invention. A feature of the first embodiment resides in that, as shown in FIG. 3A, a plurality of cell rows consisting of a plurality of standard cells (SC1, SC2, SC3, SC4, SC5, . . . ) 2 are aligned on a chip 1 and then basic cells 4 used in a gate array are aligned preliminarily in respective free areas 3 between the plurality of cell rows. In such configuration, circuit design is originally effected by use of standard cells 2. But, if circuit changes such as modification, supplement, etc. are needed thereafter, such modification, supplement, etc. are implemented using transistors in the basic cells 4 in the gate array being aligned preliminarily. The basic cells 4 may be used at the initial stage or circuit design.

According to such approach, since the gate array basic cells 4 arranged as dummies are prepared in advance and such basic cell patterns can be utilized if the need for circuit change arises thereafter, various circuit changes can be made only by changing the pattern of metal wiring layers.

Therefore, the circuit change can be simply fulfilled, unlike the standard cell methodology in the prior art, without requiring the pattern change of underlying layers such as source/drain diffusion layer, gate polysilicon layer, etc. And various preceding stage steps such as ion-implantation, CVD, RIE, etc. accompanied with such pattern change are not required in the first embodiment. As a result, the circuit change caused later can be implemented easily and in a short period of time without deteriorating a margin in circuit design characteristic to the standard cell methodology. And other advantages of the standard cell approach, such as the size and number of the transistors can be selected arbitrarily are also maintained. Since the basic cells 4 are arranged in the free areas 3 of the standard cells 2, the standard cells 2 and the basic cells 4 can also be simply mixedly-mounted to have no influence upon positions and circuit performances of the initially arranged standard cells 2 rather than the approach that the basic cells 4 are arranged instead of the standard cells 2 in locations in which the standard cells 2 are to be arranged initially.

Figure 3B:
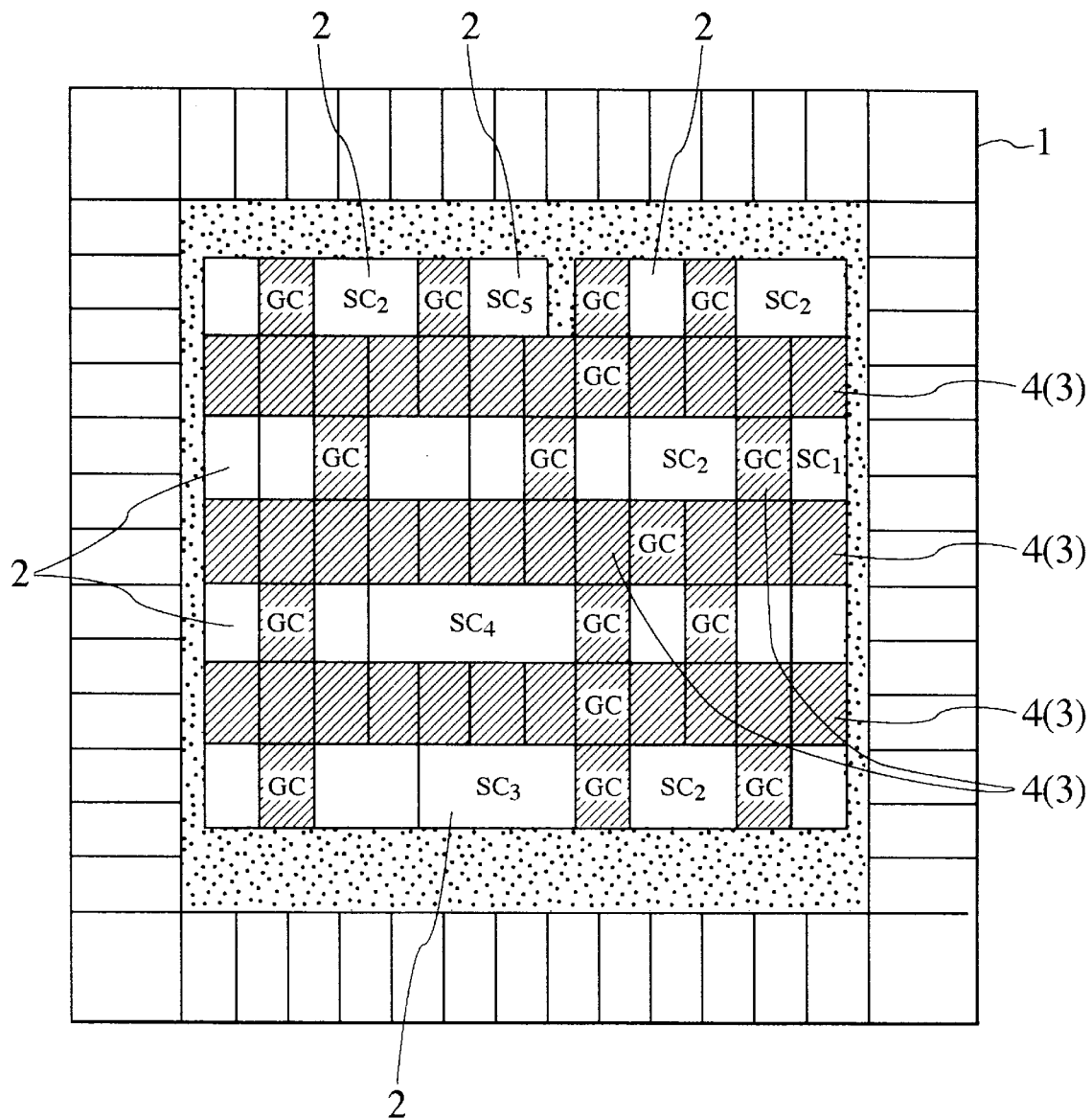
Figure 3C:
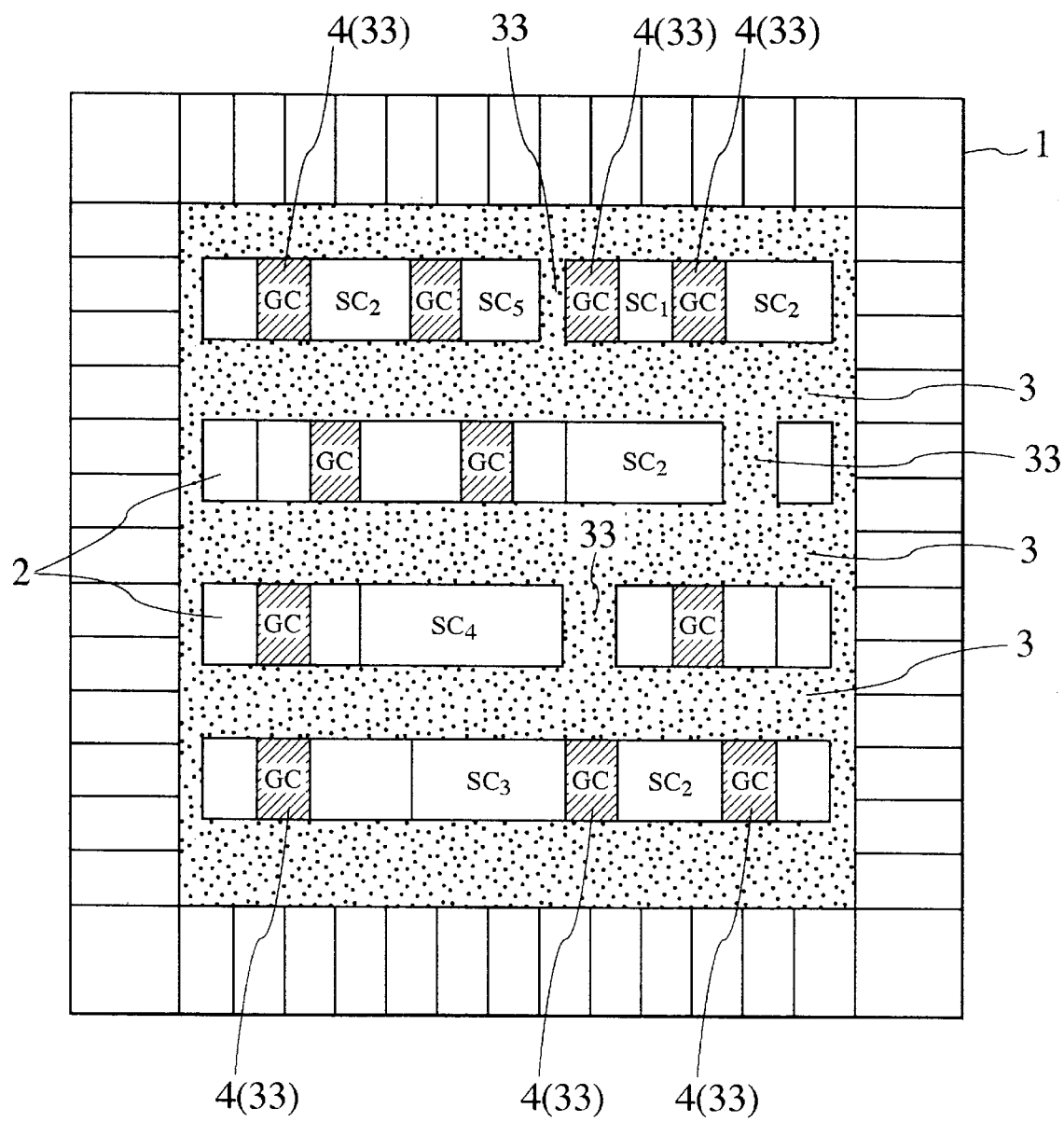

The gate array basic cells are arranged only between cell rows in FIG. 3A, but the present invention is not limited to the case shown in FIG. 3A. Normally the cell rows made of the standard cells include empty spaces 33 therein. Accordingly, as shown in FIG. 3B, the basic cells may also be arranged in the empty spaces 33 between the standard cells 2 in respective cell rows. As shown in FIG. 3C, the basic cells may also be arranged only in the empty spaces 33 between the standard cells 2. The arrangement of the basic cells in FIG. 3C becomes more effective in FIG. 3D which shows a standard cell spread-over type planar pattern. Since no wiring channel region 3 is provided in FIG. 3D, an integration density can be extremely enhanced.

Figure 4A:
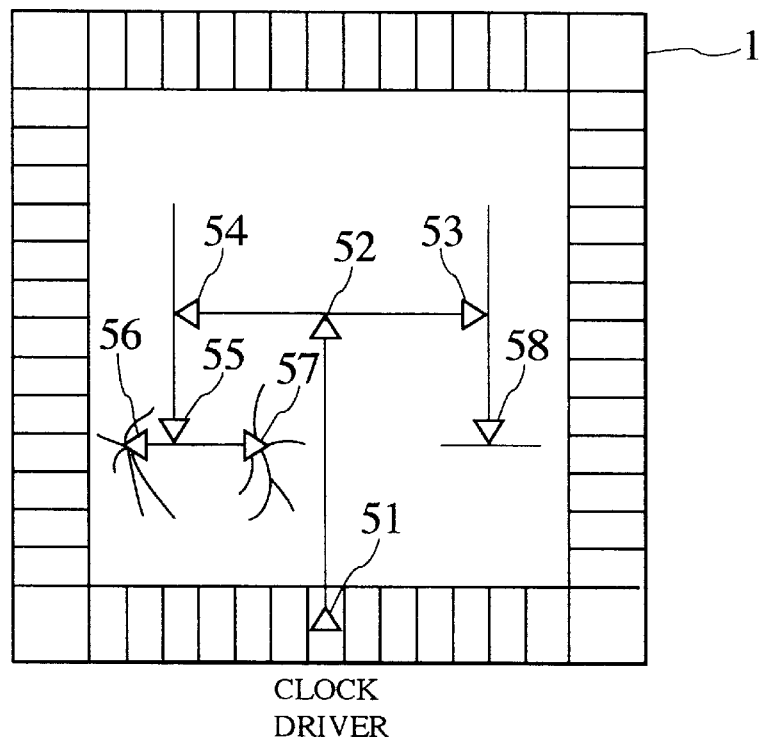
FIG. 4A is a plan view showing a tree and branches to arrange intermediate buffers to suppress clock skew.
Figure 4B:
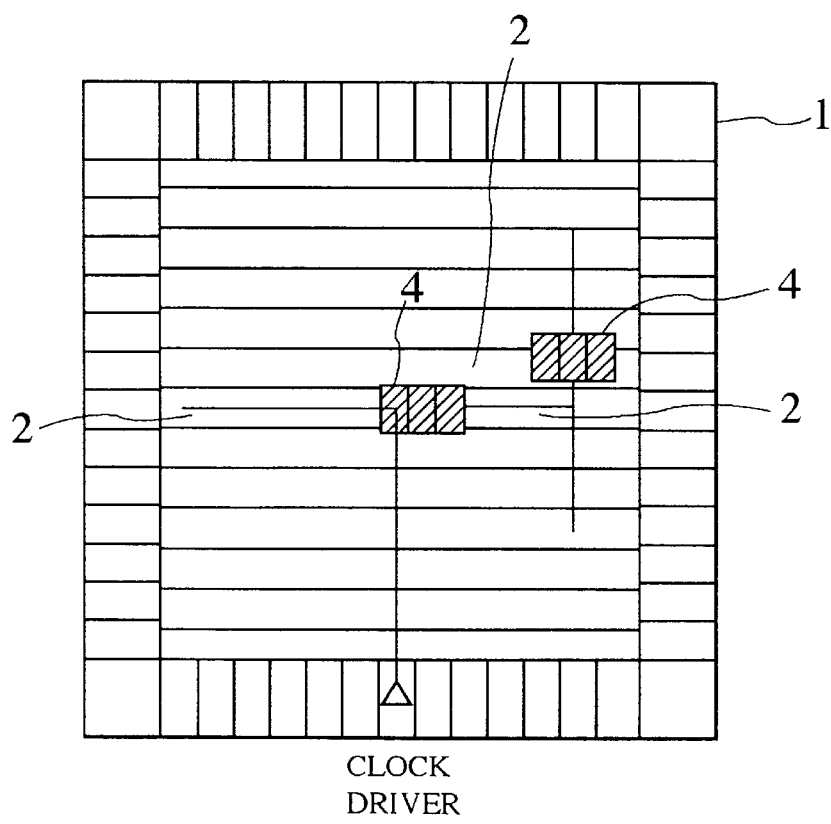
FIG. 4B is a plan view showing an arrangement of intermediate buffers after speculation of FIG. 4A to suppress clock skew in the integrated circuit using the hybrid standard cell architecture according to the first embodiment of the present invention.

The basic cells 4 arranged preliminarily as above can be utilized to not only change circuit specifications merely but also further improve performances of the circuit. For example, the basic cells 4 may be utilized in the circuit formed on the chip 1 so as to construct intermediate buffers for distributing a clock signal supplied from a clock driver 51. Normally a tree structure circuit layout as shown in FIG. 4A, etc. are employed to suppress clock skew of the circuit, but delay times up to end terminals of the circuit depends upon circuit scales of respective branches in the tree structure and the arrangement of the standard cells constituting the circuit. Hence, prediction of the delay times is extremely difficult before the standard cells are arranged, so that the circuit configuration to distribute the clock signal must be estimated and then changed in many cases after the standard cells have been arranged. In such case, if the gate array basic cells 4 are arranged in the free areas 3 and/or empty spaces 33 of the standard cells 2 previously, intermediate buffers 52, 53, . . . , 58, . . . may be formed by use of the basic cells 4 arranged previously as shown in FIG. 4B. As a consequence, the intermediate buffers 52, 53, . . . , 58, . . . to suppress the clock skew can be easily formed without changing the circuit arrangement which is originally composed of the standard cells 2.

As the result of examination and evaluation of the circuit performances executed after the circuit has been constructed with the standard cells 2. If it has been found that drive capability or the delay time is insufficient, the circuit can be changed immediately by using the standard cells 2 and the gate array basic cells 4 in combination. In other words, the circuit with the optimal drive capability and optimal delay time can be easily constructed only by changing the metal wiring layer patterns without changing the circuit constructed up to now or adding the standard cells newly.

EXAMPLE 1

Figure 3D:
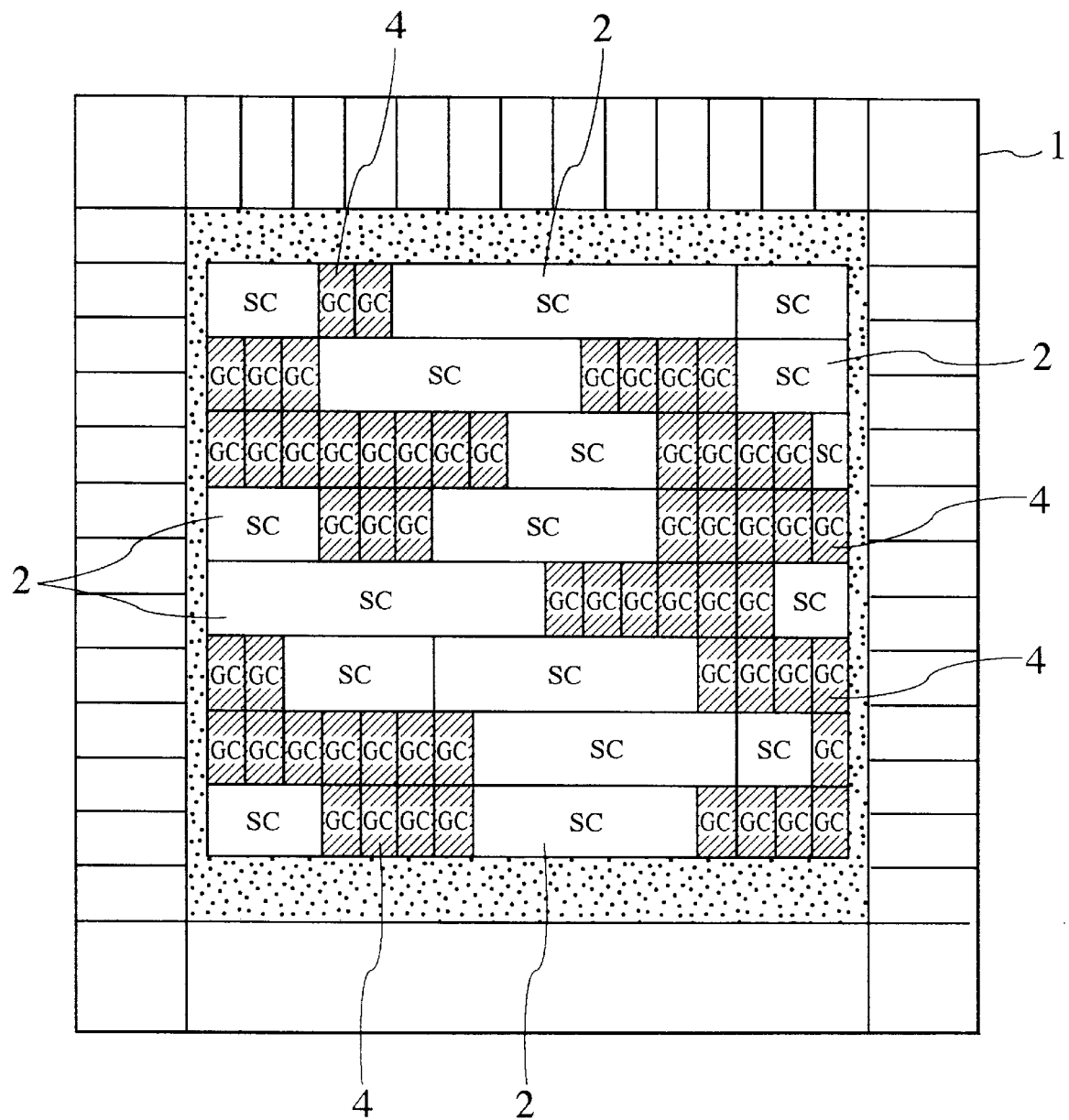
Figure 5A:
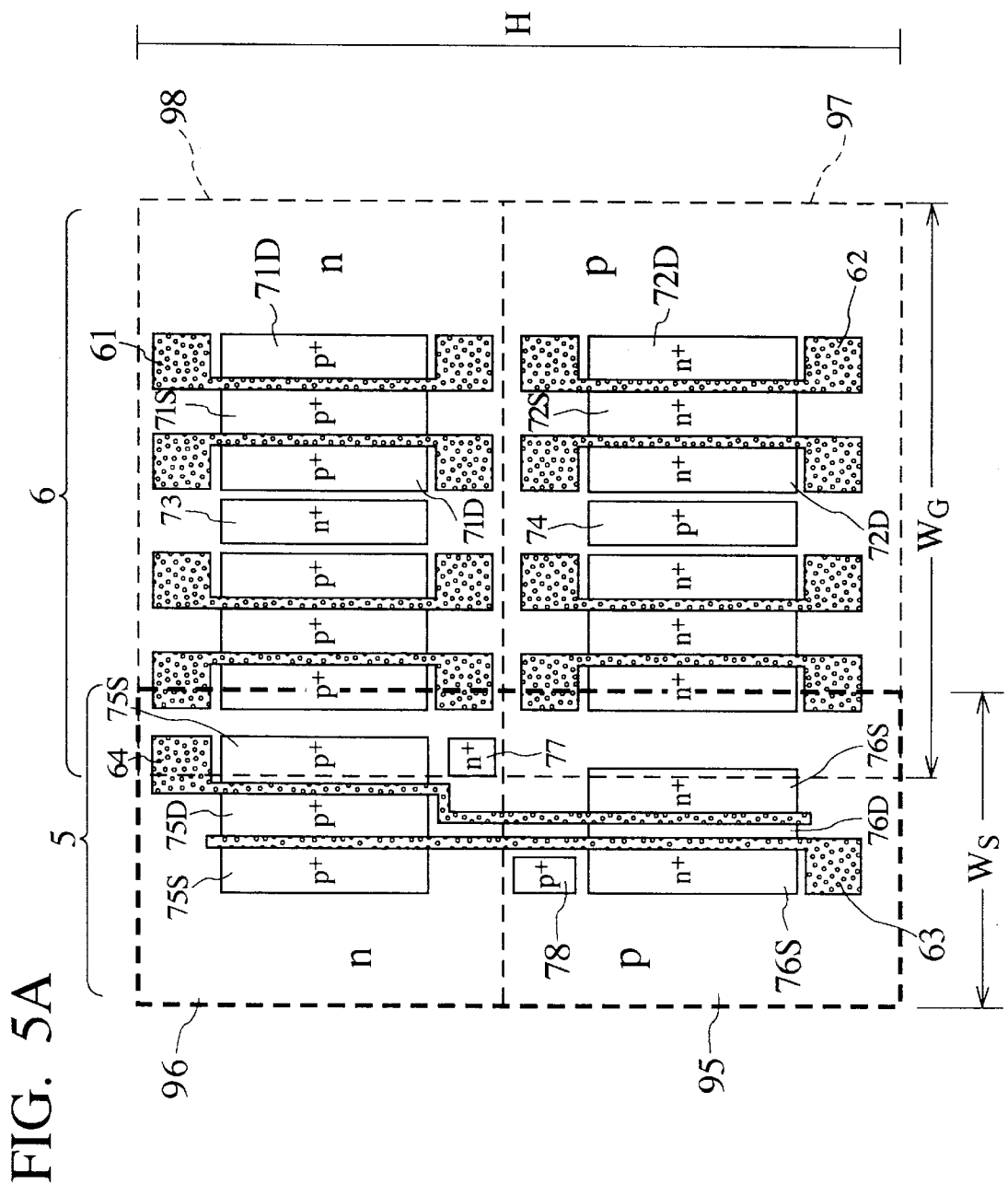
Figure 5B:
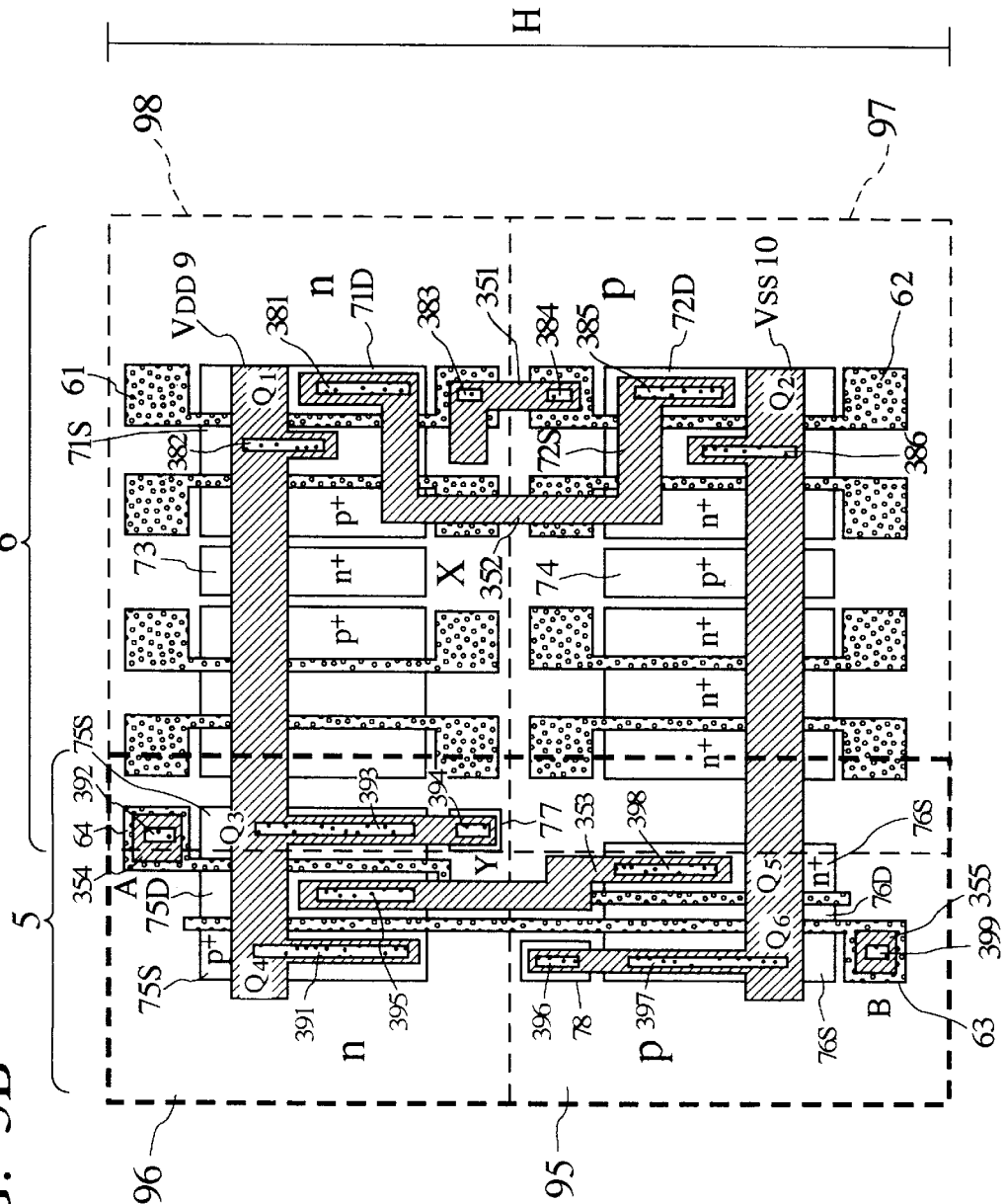
Figure 5C:
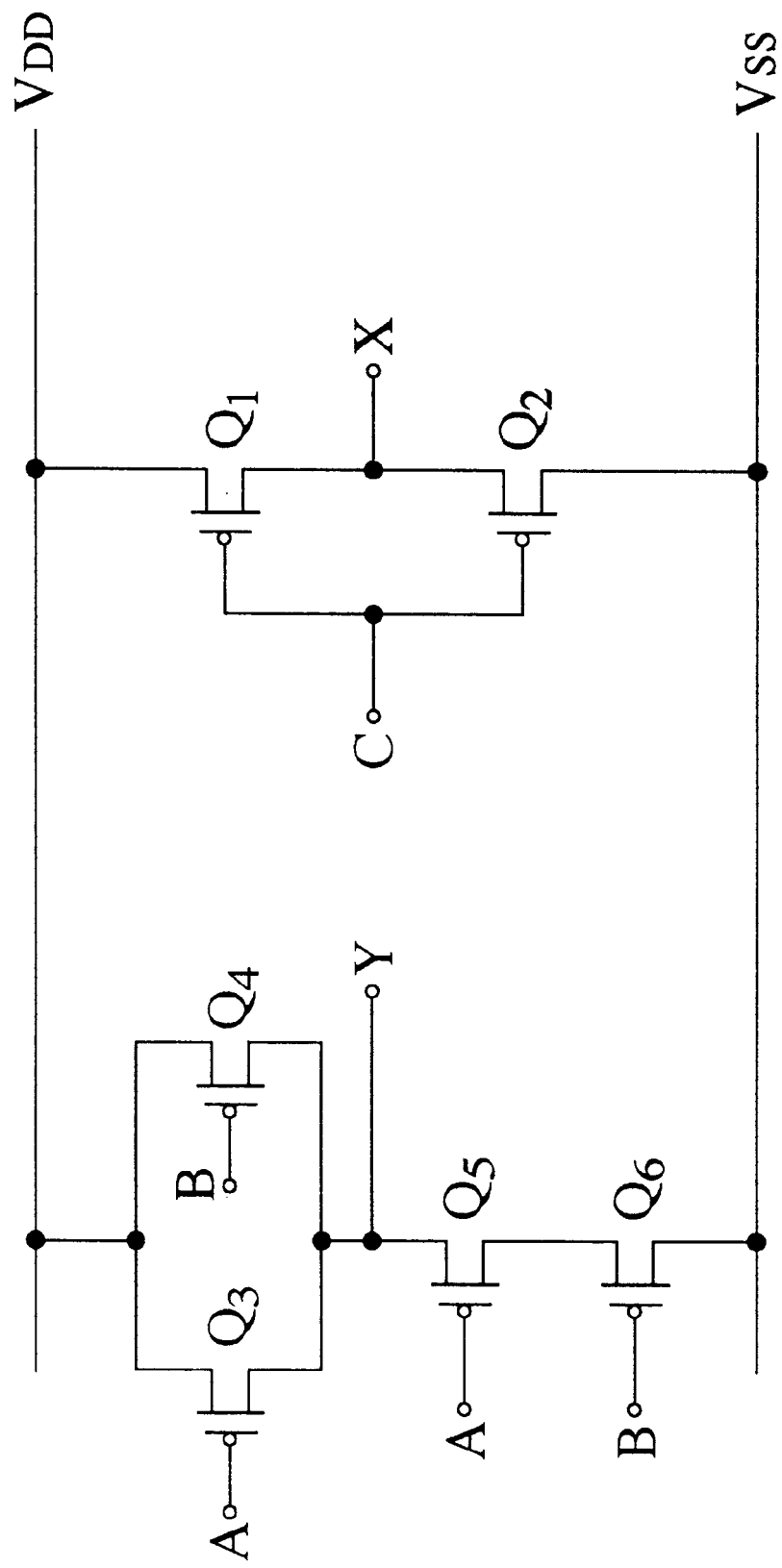

A first example according to the first embodiment of the present invention shows a layout pattern when heights H of outside dimensions (a height H and widths Ws, Wg) of the standard cells and the basic cells are made equal in the configuration shown in FIG. 3C or 3D. In other words, FIG. 5A is a plan view showing patterns before wiring layers are formed in the pattern layout obtained when the heights H are set to be equal. FIG. 5B is a view showing a situation where metal wiring layers are formed on the patterns shown in FIG. 5A to have power supply terminals (power supply wirings) on the same vertical locations in a plan view. In FIG. 5B, the standard cells constituting two-input NAND gates 5 by use of CMOSs and the gate array primitive cell constituting inverters 6 by use of CMOSs are arrange in adjacent. Where the term "primitive cell" means a cell in which metal wiring layers are formed on the "basic cell". Both cells are identical as pattern locations on the chip although they are different patterns in time series. In other words, the term "basic cell" is used in FIG. 5A and the term "primitive cell" is used in FIG. 5B, but both cells being arranged in the same locations are substantially identical to each other. However, the cell on which the metal wiring layer is not formed yet in succeeding stages in time series is still called as the "basic cell". FIG. 5C is a representation of an equivalent circuit of the layout shown in FIG. 5B.

As shown in FIG. 5A, in the first example according to the first embodiment of the present invention, an n well region 96 of the standard cell and an n well region 98 of the gate array basic cell are arranged to be overlapped partially. Also, a p well region 95 of the standard cell and a p well region 97 of the gate array basic cell are arranged to be overlapped partially. In other words, the standard cell 5 with a height H and a width $W_S$ and the gate array basic cell 6 with a height H and a width $W_G$ are arranged to be overlapped partially. A $p^+$ source region 75S, a $p^+$ drain region 75D, and an $n^+$ contact region 77 are formed in the n well region 96 of the standard cell 5. An $n^+$ source region 76S, an $n^+$ drain region 76D, and a $p^+$ contact region 78 are formed in the p well region 95 of the standard cell 5. Further, colon gate polysilicon regions 64, 65 are formed over both the a well region 96 and the p well region 95. Similarly, a $p^+$ source region 71S, a $p^+$ drain region 71D, an $n^+$ contact region 73, and a gate polysilicon region 61 are formed in the n well region 98 of the gate array basic cell. A $n^+$ source region 72S, an $n^+$ drain region 72D, and a $p^+$ contact region 74, and a gate polysilicon region 62 are formed in the p well region 97 of the gate array basic cell.

As shown in FIG. 5B, the $p^+$ source region 71S in the gate array primitive cell 6 and the $p^+$ source region 75S in the standard cell 5 are connected to a high potential power supply wiring (VDD) 9 which is provided on a line disposed on a same vertical position in a planar pattern via contact holes 382, 393, 391. Also, the n⁺ source region 72S in the gate array primitive cell 6 and the n⁺ source region 76S in the standard cell 5 are connected to a low potential power supply wiring (VSS) 10 which is provided on a line disposed on a same vertical position in a planar pattern via contact holes 386, 397.

An inverter in the gate array primitive cell is made up of a pMOSFET Q1 and an nMOSFET Q2. A wiring 351 which connects a polysilicon gate electrode 61 of the pMOSFET Q1 to a polysilicon gate electrode 62 of the nMOSFET Q2 via contact holes 383, 384 mutually acts as an input terminal C of the inverter. A wiring 352 which connects a p⁺ drain region 71D of the pMOSFET Q1 to an n⁺ drain region 72D of the nMOSFET Q2 via contact holes 381, 385 mutually acts as an output terminal X of the inverter.

A two-input NAND formed in the standard cells consists of two pMOSFETs Q3, Q4 which are connected in parallel to the high potential power supply wiring (VDD) 9 and two nMOSFETs Q5, Q6 which are connected in series between a p⁺ drain region 75D common to the pMOSFETs Q3, Q4 and the low potential power supply wiring (VSS) 10. A metal terminal 354 which is connected to a polysilicon gate electrode 64 common to the pMOSFET Q3 and the nMOSFET Q5 via a contact hole 392 serves as one input terminal A of the two-input NAND. A metal terminal 355 which is connected to a polysilicon gate electrode 63 common to the pMOSFET Q4 and the nMOSFET Q6 via a contact hole 398 serves as the other input terminal B of the two-input NAND. A wiring 353 which connects a p⁺ drain region 75D common to the pMOSFETs Q3. Q4 to an n⁺ source region 76S of the nMOSFET Q5 via contact holes 395, 398 mutually serves as an output terminal Y of the two-input NAND.

With such configuration, since the height (H) of outside dimensions of respective cells, vertical positions of the high potential power supply wiring (VDD) 9 and the low potential power supply wiring (VSS) 10 are designed to be identical, respectively, the basic cells can be arranged readily between the standard cells. In addition, since power supply wirings 9, 10 of both cells are caused to be connected only by arranging both cells adjacently, connection of the power supply wirings can be easily made. Further, signal wirings other than the power supply wirings may be formed to be identical in vertical position on the plan view shown FIG. 5B. In such case, it is feasible to connect easily the signal wirings of both cells to each other.

EXAMPLE 2

Figure 6:
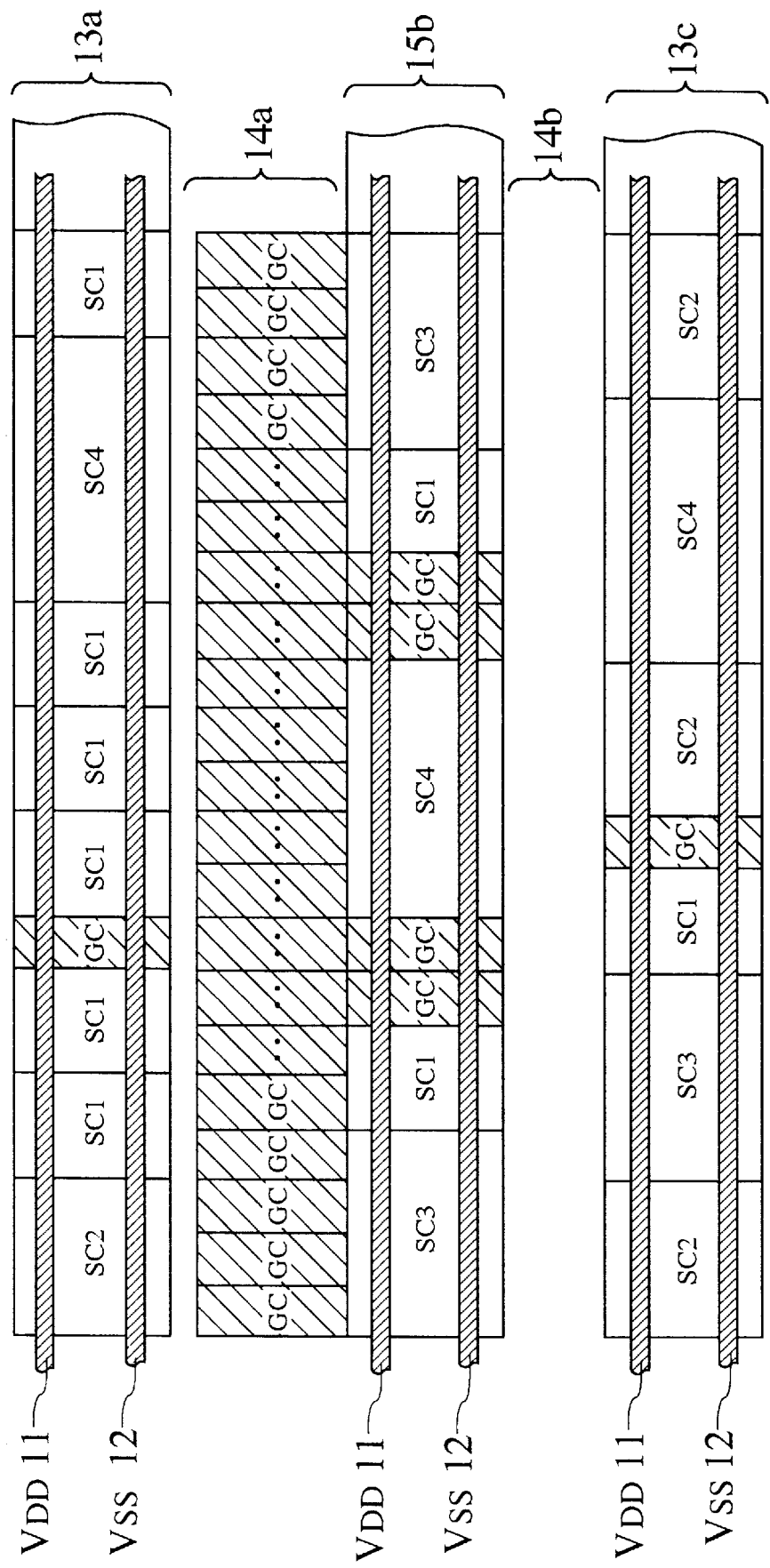
FIG. 6 is a plan view illustrating a configuration of an integrated circuit using the hybrid standard cell architecture according to a second example of the first embodiment of the present intention.

FIG. 6 is a plan view illustrative of a configuration of an integrated circuit using the hybrid standard cell architecture according to a second example of the first embodiment of the present invention. As shown in FIG. 6, standard cells SC1 to SC4 of four types having a uniform height but different widths are arranged on a semiconductor chip. A feature of the second example is that the gate array basic cells GC which are designed to have the same height as the standard cells SC1 to SC4 are selectively arranged in a free area 14a which has a height higher than those of the standard cells SC1 to SC4 (i.e., heights of cell rows 13a, 13b, 13c) out of free areas 14a, 14b between the cell rows 13a, 13b, 13c in which the standard cells SC1 to SC4 are arranged. In addition, one gate array basic cell GC is arranged in the cell row 13a, four gate array basic cells GC are arranged in the cell row 13b, and one gate array basic cell GC is also arranged in the cell row 13c. These basic cells GC are designed to have the same height as the standard cells SC1 to SC4 and to be connected to the high potential power supply wiring (VDD) 11 and the low potential power supply wiring (VSS) 12 at the same vertical location as the standard cells SC1 to SC4.

In FIG. 6, other signal wirings except power supply wirings 11, 12 are omitted. In such second example, similar advantages to those in the above first embodiment can be achieved.

EXAMPLE 3

Figure 7:
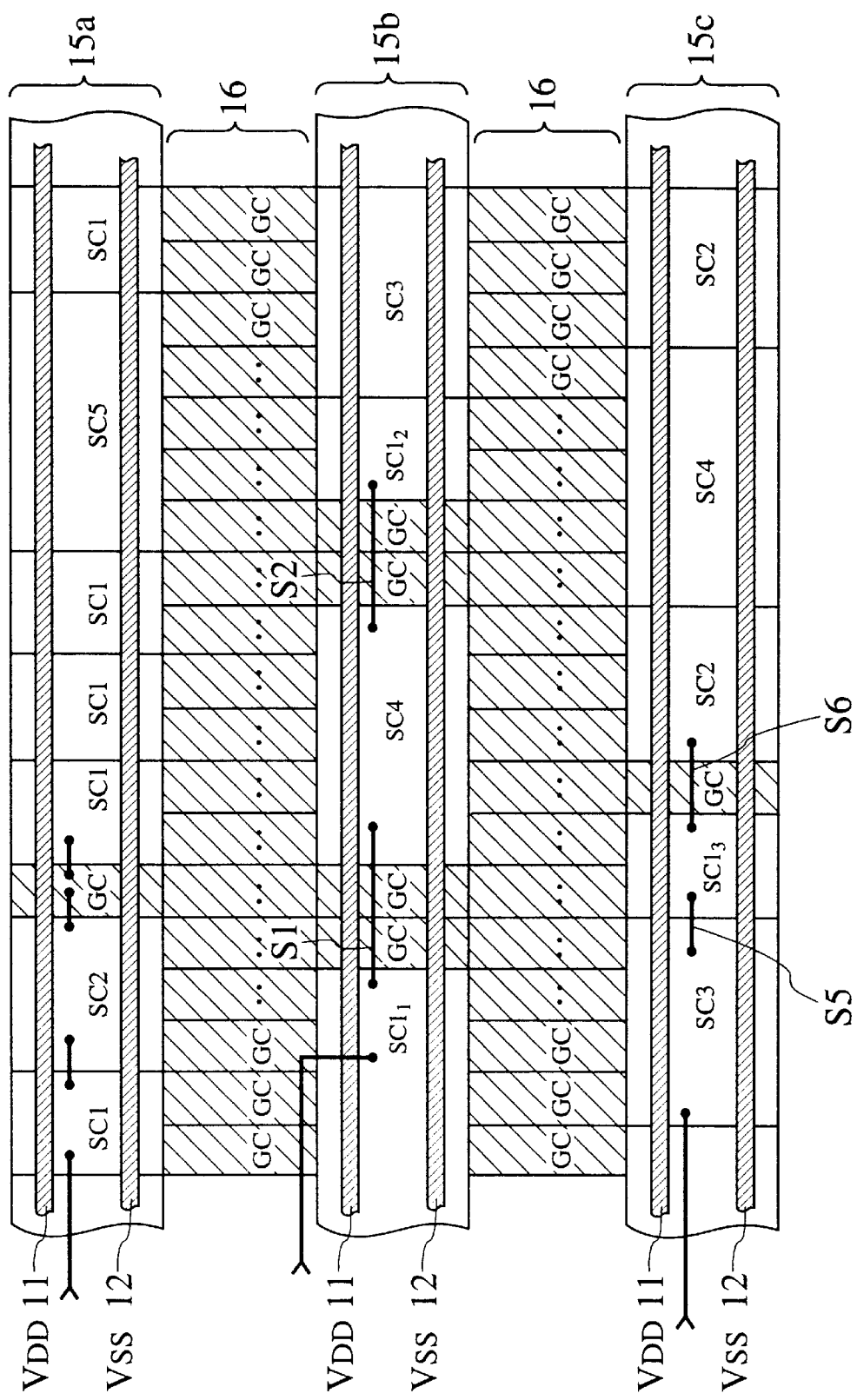
FIG. 7 is a plan view illustrating a configuration of an integrated circuit using the hybrid standard cell architecture according to a third example of the first embodiment of the present invention.

FIG. 7 is a view illustrative of a configuration of an integrated circuit using the hybrid standard cell architecture according to a third example of the first embodiment of the present invention. As shown in FIG. 7, the third example is characterized in that the gate array basic cells GC which are designed to have the same height as the standard cells SC1 to SC5 are arranged in the free areas 16 between the cell rows 15a, 15b, 15c in which the standard cells SC1 to SC5 of five types having a uniform height but different widths are arranged. In addition, one gate array basic cell GC is arranged in the cell row 15a, four gate array basic cells GC are arranged in the cell row 15b, and one gate array basic cell GC is also arranged in the cell row 15c. The height of these basic cells GC which are inserted into the cell rows 15a, 15b, 15c respectively is designed to be identical to those of the standard cells SC1 to SC4. The high potential power supply wiring (VDD) 11 and the low potential power supply wiring (VSS) 12 of the basic cells GC which are inserted into the cell rows 15a, 15b, 15c respectively are designed to be provided at the same vertical location as the standard cells SC1 to SC4. In FIG. 7, in the cell row 15b, the standard cell SC1₁ is connected to the standard cell SC4 via a wiring s1 and also the standard cell SC4 is connected to the standard cell SC1 via a wiring s2. In the cell row 15c, the standard cell SC3 is connected to the standard cell SC1₃ via a wiring s5 and also the standard cell SC1₃ is connected to the standard cell SC2 via a wiring s6.

In the design process of the standard cells which have the free areas 16 between the cell rows, as shown in FIG. 7, the height of the free areas 16 between the cell rows or the height of the standard cells is variable. The standard cell design methodology has such an advantage that a size of the transistor can be selected freely to carry out the pattern design according to user's specifications from the initial stage and optimization of wirings to connect respective standard cells can be facilitated. Since the standard cell design methodology has such margin in design, the height of the standard cell is in general lower than that of the gate array basic cell. If the height of the gate array basic cell is lower than that of the common gate array basic cell, a difference in height between the standard cell and the gate array basic cell can be reduced, so that an increase in area can be made small even if the basic cells are mounted mixedly with the standard cells. Therefore, if the standard cells each has a smaller width and a substantially same area as the gate array basic cell are substituted initially by the gate array basic cells, as shown in FIG. 7, the number of the basic cells usable for circuit modification can be increased when such circuit modification is needed, so that changing operation in design can be facilitated. As a result, if design change is requested in the course of design, such design change can be satisfied only by changing the wiring layer forming step et seq. and therefore a time consumed to modify the circuit can be lessened. If there exists location where replacement of the standard cell will be expected later in the cell rows 15a, 15b, 15c even when the area of the standard cells is not the same as the gate array basic cell, the basic cell GC may be arranged previously in such location in place of the standard cell, in this case, changing operation in design can also be facilitated.

EXAMPLE 4

Figure 8:
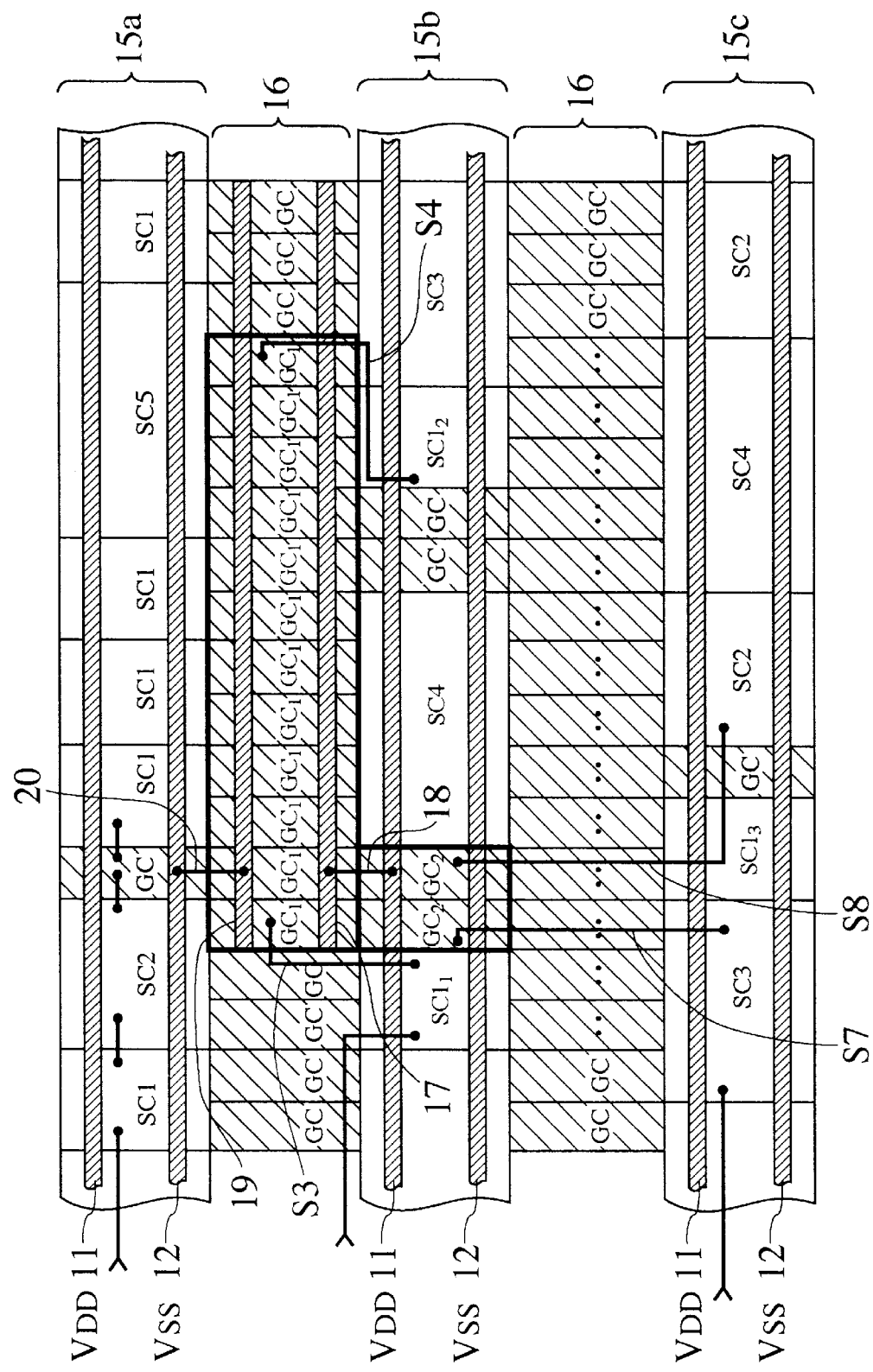
FIG. 8 is a plan view illustrating a configuration of an integrated circuit using the hybrid standard cell architecture according to a fourth example of the first embodiment of the present invention, wherein modifications are introduced into the circuit configuration shown in FIG. 7.

In the above third example, the basic cell arrays CC which are arranged in the free areas 16 in the layout pattern shown in FIG. 7 have not been mentioned. FIG. 8 is a view illustrative of an example (fourth example of the first embodiment of the present invention) wherein circuit change is effected by changing the wiring step et seq. with the use of the basic cell arrays GC which are arranged in the free areas 16. In FIG. 7 illustrative of the third example, in the cell row 15b, the standard cell $SC1_1$ has been connected to the standard cell SC4 via the wiring s1 and also the standard cell SC4 has been connected to the standard cell $SC1_2$ via the wiring s2. On the contrary, according to the circuit change in the fourth example, the basic cell array $GC_1$ arranged in the free area 16 is employed instead of the standard cell SC4. Namely, the basic cell array $GC_1$ and the standard cell $SC1_1$ are connected via a wiring s3. And also the basic cell array $GC_1$ and the standard cell $SC1_2$ are connected via a wiring s4. Hence, the wirings s1, s2 shown in FIG. 7 are eliminated. The high potential power supply wiring (VDD) 17 of the basic cell array $GC_1$ arranged in the free areas 16 is connected to the high potential power supply wiring 11 in the cell row 15b via a wiring 18. Similarly, the low potential power supply wiring (VSS) 19 of the basic cell array $GC_1$ is connected to the low potential power supply wiring 12 in the cell row 15a via a wiring 20.

Furthermore, according to the circuit change shown in FIG. 7, in the cell row 15c, the standard cell SC3 has been connected to the standard cell $SC1_3$ via the wiring s5 and also the standard cell $SC1_3$ has been connected to the standard cell SC2 via the wiring s6. On the other hand, in the fourth example, as shown in FIG. 8, two basic cells $GC_2$ arranged in the cell row 15b are employed instead of the standard cell $SC1_3$. In other words, in FIG. 8, the basic cell $GC_2$ and the standard cell SC3 are connected via a wirings s7 and also the basic cell $GC_2$ and the standard cell SC2 are connected via a wiring s8, thereby eliminating the wirings s5, s6. The wiring layers for the standard cell SC4 in the cell row 15b and the standard cell $SC1_2$ in the cell row 15c, which are not used, are removed.

As apparent from the third and fourth examples, according to the first embodiment of the present invention, circuit Modification can be implemented only by changing the wirings so that circuit change can be achieved easily and in a short period of time. In addition, a semicustom ASIC can be constructed by employing the standard cells and the basic cells on the same semiconductor chip.

EXAMPLE 5

Figure 9:
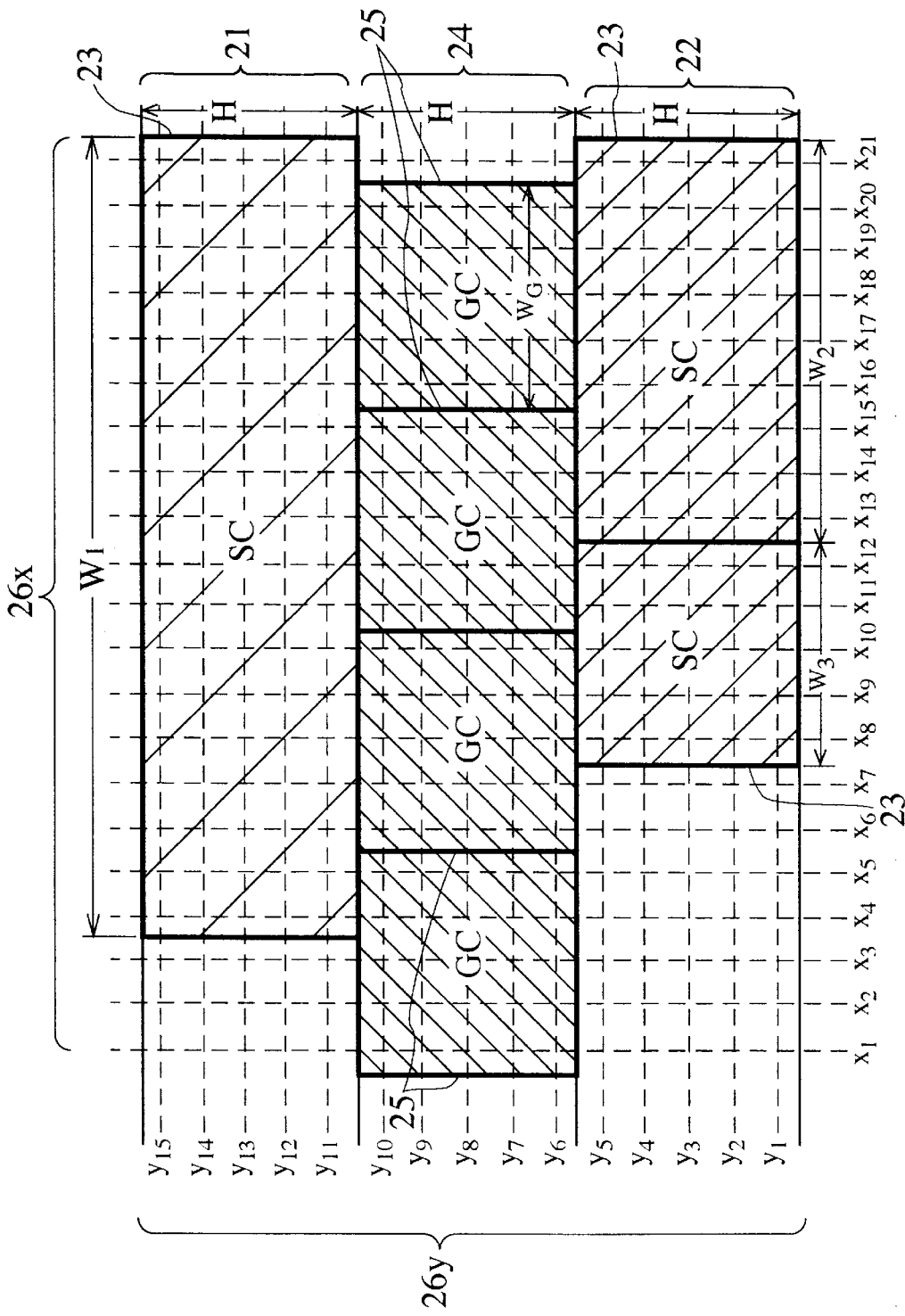
FIG. 9 is a plan view illustrating a configuration of an integrated circuit using the hybrid standard cell architecture according to a fifth example of the first embodiment of the present invention.

FIG. 9 is a view illustrative of a configuration of an integrated circuit using the hybrid standard cell architecture according to a fifth example of the first embodiment of the present invention.

In FIG. 9, a wiring grid 26x–26y is formed on the standard cells 23 (areas surrounded by a thick solid line and shaded by left-upwardly oblique lines) arranged in the cell rows 21, 22 and the gate array basic cells (areas surrounded by a thick solid line and shaded by right-upwardly oblique lines) 25 arranged in the free area 24. A feature of the fifth example resides in that geometrical relationship between the standard cells 23 and the basic cells 25 along vertical lines are adjusted such that the wirings having a fixed width can be passed through vertical line groups $x_1, x_2, \ldots, x_{21}, \ldots$ of the wiring grid 26x–26y not to generate difference in level at the cell row 21, the free area 24, and the cell row 22. It is of course that, like the second to fourth examples, left to right relations are adjusted along the lateral line groups $y_1, y_2, \ldots, y_{15}, \ldots$ In other words, in the integrated circuit using the hybrid standard cell architecture according to the fifth example of the first embodiment of the present invention, the standard cells 23 and the basic cells 25 are arranged pursuant to the same wiring grid system 26x–26y.

According to such fifth example, the metal wirings on the gate array disposed in the free area 24 between the cell rows can be easily laid along the wiring grid 26x–26y. In addition, if the outside dimensions of the standard cell 23 (height H and widths $W_1, W_2, W_3, \ldots$) are designed based upon the outside dimension of the gate array basic cell 25 (height H and weight $W_G$) as basic unit, constraints on the arrangement and routing can be relaxed further and therefore their mixedly mounting can be facilitated. For example, the circuit may be designed such that the widths $W_1, W_2, W_3, \ldots$ of the standard cells 23 are integral n multiple (n=1, 2, 3, . . . ) of the width $W_G$ of the gate array basic cell 25.

EXAMPLE 6

Figure 10A:
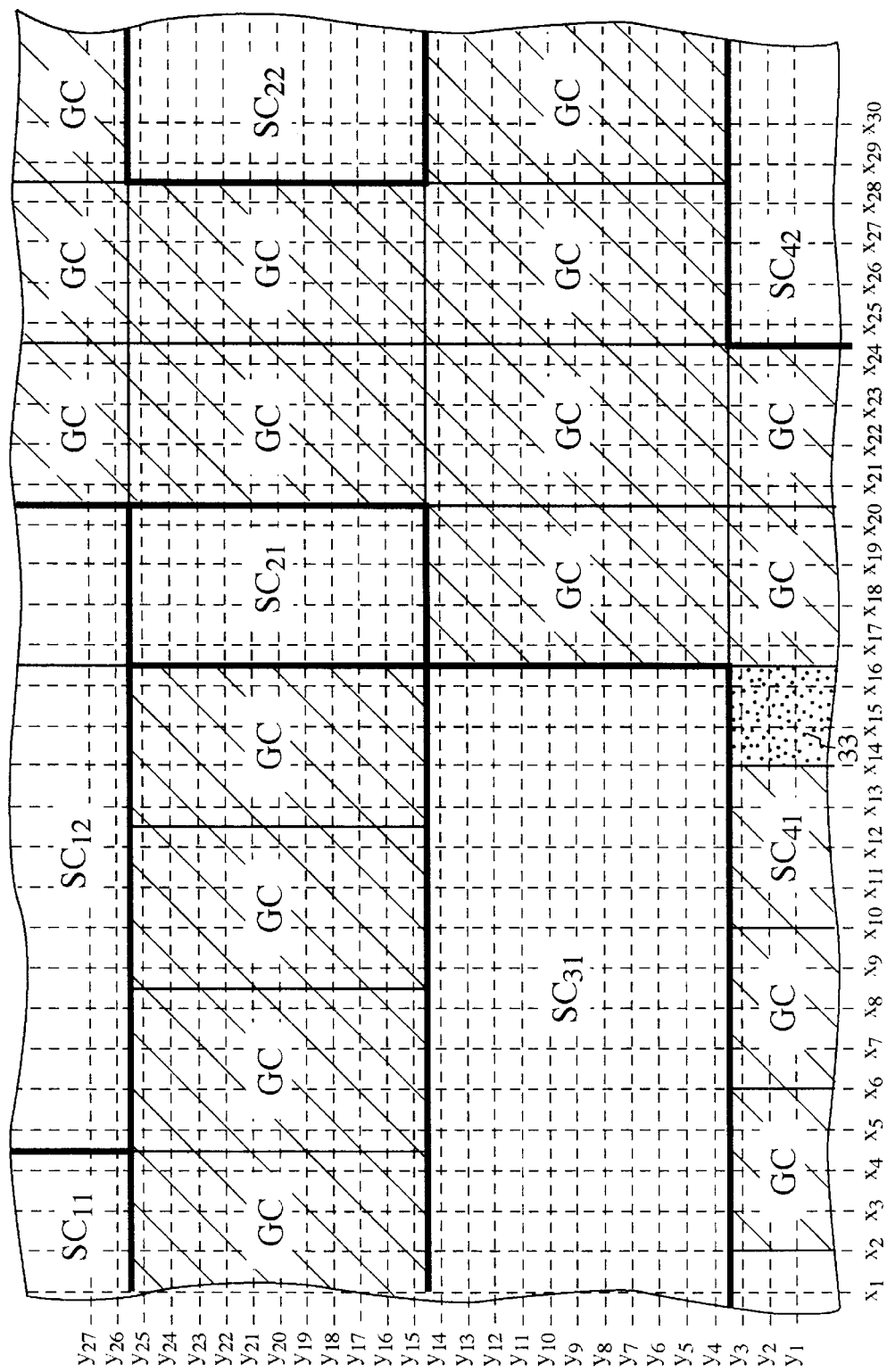
FIG. 10A is a plan view illustrating a configuration of an integrated circuit using the hybrid standard cell architecture according to a sixth example of the first embodiment of the present invention, wherein gate array basic cells are arranged in empty spaces of channelless standard cell.

FIG. 10A shows a sixth example wherein the first embodiment of the present invention is applied to an arrangement of channelless type standard cells. More particularly, the gate array basic cells GC are arranged in the empty spaces 33 on the arrangement pattern of the standard cells $SC_{11}, SC_{12}, SC_{21}, SC_{31}, SC_{41}, SC_{42}$. Such advantages can be accomplished that integration density can be improved by spreading the channelless standard cells all over the surface and wiring design can be made easy because no fixed wiring area remains, and in addition the circuit change can be very facilitated since the gate array basic cells are provided in the periphery. Like the fifth embodiment, the standard cells $SC_{11}, SC_{12}, SC_{21}, SC_{22}, SC_{31}, SC_{41}, SC_{42}$ and the gate array basic cells GC are arranged pursuant to the same wiring grid $x_1, x_2, \ldots, x_{30}, \ldots; y_1, y_2, \ldots, y_{27}, \ldots$.

Figure 10B:
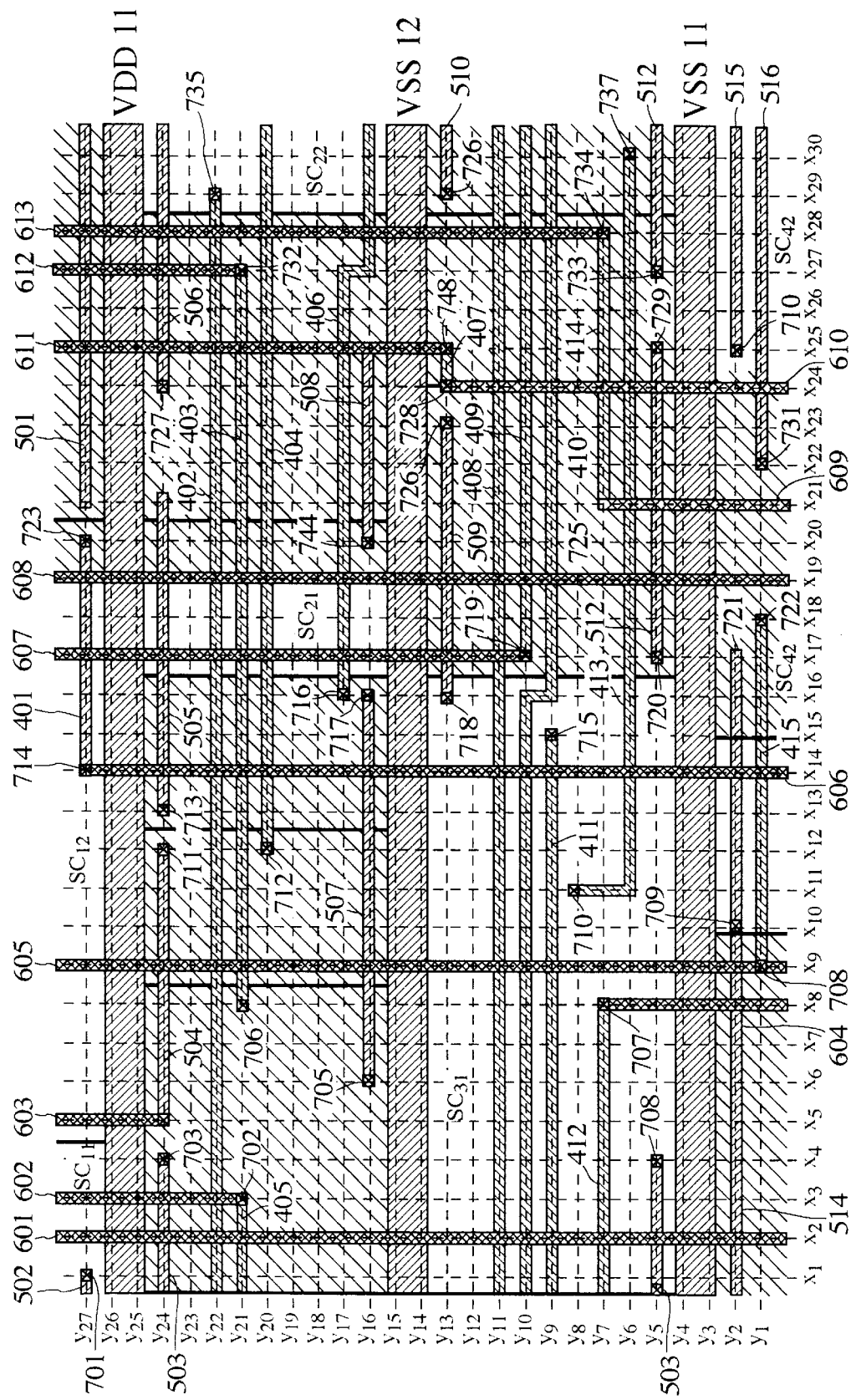
FIG. 10B is a plan view illustrating an example in which first to third level metal wirings are arranged on the configuration shown in FIG. 10A.

FIG. 10B is an example in which metal wiring layers are formed by use of the wiring grid $x_1, x_2, \ldots, x_{30}, \ldots; y_1, y_2, \ldots, y_{27}, \ldots$ with respect to the underlying pattern shown in FIG. 10A. As shown in FIG. 10B, the high potential power supply wirings (VDD) 11 and the low potential power supply wiring (VSS) 12 are placed along boundaries between upper cell rows and the lower cell rows as the power supply wirings common to the upper and lower cell rows respectively. The high potential power supply wiring (VDD) 11, the low potential power supply wiring (VSS) 12, and horizontal wirings 501, 502, . . . , 516 constitute the first level metal wiring. Horizontal wirings 401, 402, . . . , 415 constitute the second level metal wiring, and vertical wirings 601, 602, . . . , 613 constitute the third level metal wiring. Connection between these first level metal wirings and the standard cells or the gate array basic cells, connection between these second level metal wirings and the standard cells or the gate array basic cells, connection between the first level metal wirings and the second level metal wirings, connection between the second level metal wirings and the third level metal wirings, etc. are made via contact holes (or via holes) 701, 702, . . . , 737 provided in respective underlayer insulating films which are formed below these wirings or between these wirings. FIG. 10B is an example and therefore it is needless to say that the fourth level and further upper level metal wirings may be provided.

Second Embodiment

Figure 11:
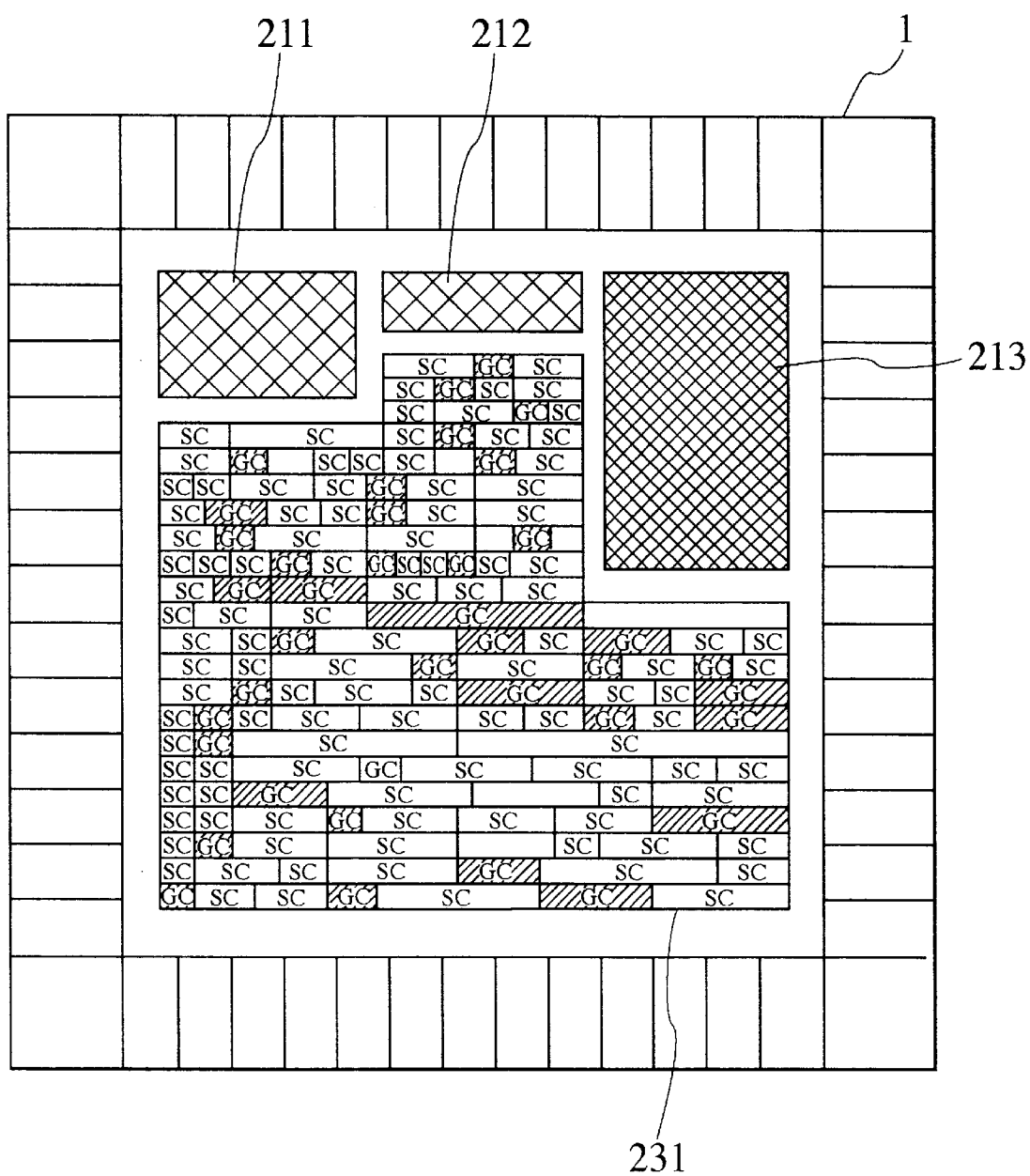
FIG. 11 is a schematic plan view showing a pattern arrangement of an integrated circuit using a hybrid standard cell architecture according to a second embodiment of the present invention. wherein megacells, megafunctions, and standard cell/gate array mixedly-mounted logic blocks are mounted on the same chip.

FIG. 11 is a view showing a configuration of overall integrated circuit chip using the hybrid standard cell architecture according to a second embodiment of the present invention. The second embodiment of the present invention is concerned with a large scale circuit system, in which memories. CPU core, ALU, A/D converter, D/A converter, display, and various I/O circuits are included. In the large scale circuit system such as recent LSIs for multimedia application, miscellaneous subsystems are mounted with logic circuit on a same LSI chip, and the second embodiment of the present invention explain the large scale circuit system. More particularly, an LSI will be explained wherein megacells 213 such as ROM, RAM, etc., megafunctions 211, 212 such as ALU, CPU, core, etc., and logic circuit area (logic blocks) 231 are mounted on the same semiconductor chip.

In the logic block on the LSI chip 1 shown in FIG. 11, the gate array basic cells GC are arranged in the empty spaces of the standard cells SC while using channelless standard cells as the basic elements. In the prior art, the pattern arrangement of similar mixed type LSI chip which is called as the embedded array have been known. However, since either the gate array basic cells or the standard cells are spread all over the logic block in such embedded array, the underlying patterns must be changed or ion-implantation, etc. must be executed again if the circuit change is needed. As a consequence, a long period of time has been required to design and manufacture the circuit.

In the second embodiment of the present invention, as shown in FIG. 11, the gate array basic cells GC are arranged preliminarily in the empty spaces in which the standard cells SC are not arranged in the logic block 231, and the circuit change is made by use of the basic cells GC. Therefore, various circuit change can be implemented only by changing the wirings with no influence on the circuit configuration of the standard cells, so that turn around time can be shortened. In addition, if specifications of the standard cells SC and the basic cells GC are mated with each other to be arranged on the same grid, mixed standard cell and basic cell layout can be facilitated and also constraints in arrangement and routing can be relaxed widely in contrast to the prior art.

Especially, the gate array basic cells have such a disadvantage that sometimes power consumption cannot be reduced by reducing the transistors according to specifications since sizes of the transistors are fixed. In contrast, since sizes of the transistors can be varied even if the height of the cell is fixed, power consumption in the standard cells can be reduced by reducing the sizes of the transistors according to requested specifications. Hence, power consumption of overall LSI chip can be reduced by combining the gate array basic cells with the standard cells appropriately. Furthermore, it is similar to the first embodiment that intermediate buffers can be arranged easily by means of combinations of the standard cells and the gate array basic cells to increase the driving capability and to suppress the clock skew.

In the second embodiment of the present invention, it is a matter of course that the structure which has the wiring channel regions explained in the first embodiment may be adopted as patterns in the logic block 231. Of course, the structures explained in the first to sixth example of the first embodiment may be applied to the second embodiment.

Whether a total occupied area of the standard cells SC in the logic block 231 or the gate array basic cells GC is set larger is a matter of choice. A ratio of total areas may be selected depending upon circuit specifications.

Various modifications will become possible for those skilled in the art after receiving the teachings of the present disclosure without departing from the scope thereof.

What is claimed is:

1. A semicustom integrated circuit comprising:
   (a) a plurality of cell rows, in each row a plurality of standard cell are arranged, the standard cells being configured as rectangular pattern regions having a predetermined height, and different widths so that the standard cells include first and second type cells; and
   (b) gate array basic cells formed in an empty space of a predetermined cell row of the plurality of cells rows, each of the basic cells being configured as a rectangular pattern region having a height substantially identical to said predetermined height and a width equal to the width of the first type cell, said width of the basic cells not being equal to the width of the second type cell.

2. The integrated circuit of claim 1, wherein the basic cells are used to construct additional circuits for increasing driving capability to drive signals transmitted to a plurality of circuits disposed on a semiconductor substrate.

3. The integrated circuit of claim 1, further comprising; gate array basic cells formed in wiring channel regions disposed between the plurality of cell rows.

4. The integrated circuit of claim 1, wherein respective cell rows are arranged adjacently.

5. The integrated circuit of claim 3, wherein the basic calls formed in the wiring channel regions are formed on a basis of a rectangular pattern having a height substantially identical to that of the standard cells.

6. The integrated circuit of claim 3, wherein the standard cells and the basic cells are arranged adjacently along a direction orthogonal to the cell rows.

7. The integrated circuit of claim 4, wherein the standard cells and the basic cells are arranged adjacently along a direction orthogonal to the cell rows.

8. The integrated circuit of claim 3, wherein the standard cells and the basic cells which are arranged adjacently along a direction orthogonal to the cell rows have common signal lines.

9. The integrated circuit of claim 4, wherein the standard cells and the basic cells which are arranged adjacently along a direction orthogonal to the cell rows have common signal lines.

10. The integrated circuit of claim 1, wherein the standard cells and the basic cells have common power supply lines arranged along a straight line.

11. The integrated circuit of claim 1, wherein the standard cells and the basic cells have common signal lines arranged along a straight line.

12. The integrated circuit of claim 1, wherein widths of the standard cells are integral multiple of a width of the basic cells.

13. The integrated circuit of claim 5, wherein widths of the standard cells are integral multiple of a width of the basic cells.

14. The integrated circuit of claim 1, wherein the standard cells and the basic cells are arranged pursuant to a same grid system.

15. The integrated circuit of claim 3, wherein the standard cells and the basic cells are arranged pursuant to a same grid system.

16. The integrated circuit of claim 1, wherein the basic cells are used to construct intermediate buffers for distributing a clock signal to a plurality of circuits which are displaced on a semiconductor substrate.

17. The integrated circuit of claim 3, wherein the basic cells are used to construct intermediate buffers for distributing a clock signal to a plurality of circuits which are displaced on a semiconductor substrate.

18. The integrated circuit of claim 3, wherein the basic cells are used to construct additional circuits for increasing driving capability to drive signals transmitted to a plurality of circuits disposed on a semiconductor substrate.

19. A semicustom integrated circuit having a logic circuit area and at least one of megacell and megafunction on a single semiconductor chip, the logic circuit area comprising:

(a) a plurality of cell rows, in each row a plurality of standard cells are arranged, the standard cells being configured as rectangular pattern regions having a predetermined height, and different widths so that the standard cells include first and second type cells; and (b) gate array basic cells formed in an empty space of the standard cells in predetermined cell row of the plurality of cell rows, each of the basic cells being configured as a rectangular pattern region having a height substantially identical to said predetermined height and a width equal to the width of the first type cell, said width of the basic cells not being equal to the width of the second type cell.

20. The integrated circuit of claim 19, further comprising:

gate array basic cells formed in wiring channel regions between the plurality of cell rows.

21. The integrated circuit of claim 10, wherein the standard cells and the basic cells are arranged pursuant to a same grid system.

* * * * *